United States Patent
Nomura et al.

[11] Patent Number: 5,969,428
[45] Date of Patent: Oct. 19, 1999

[54] ALIGNMENT MARK, MANUFACTURING METHOD THEREOF, EXPOSING METHOD USING THE ALIGNMENT MARK, SEMICONDUCTOR DEVICE MANUFACTURED USING THE EXPOSING METHOD

[75] Inventors: Hiroshi Nomura, Kawasaki; Iwao Higashikawa, Tokyo; Akitoshi Kumagae, Yachiyo, all of Japan

[73] Assignee: Kabushiki Kaisha Toshiba, Kawasaki, Japan

[21] Appl. No.: 09/086,609

[22] Filed: May 29, 1998

Related U.S. Application Data

[62] Division of application No. 08/873,563, Jun. 12, 1997, Pat. No. 5,847,468, which is a continuation of application No. 08/536,266, Sep. 29, 1995, abandoned.

[30] Foreign Application Priority Data

| Sep. 30, 1994 | [JP] | Japan | 6-236255 |
| Sep. 30, 1994 | [JP] | Japan | 6-238032 |
| Mar. 15, 1995 | [JP] | Japan | 7-082090 |

[51] Int. Cl.$^6$ .................................................. H01L 23/544
[52] U.S. Cl. .......................................... 257/797; 257/752
[58] Field of Search ..................... 257/797, 752; 438/401, 462, 975

[56] References Cited

U.S. PATENT DOCUMENTS

| 5,308,682 | 5/1994 | Morikawa . |
| 5,311,061 | 5/1994 | Scheck . |
| 5,334,466 | 8/1994 | Yasui et al. . |
| 5,475,268 | 12/1995 | Kawagoe et al. . |
| 5,525,840 | 6/1996 | Tominaga ............... 257/797 |
| 5,528,372 | 6/1996 | Kawashima . |
| 5,532,520 | 7/1996 | Haraguchi et al. . |
| 5,700,732 | 12/1997 | Jost et al. ............... 257/797 |

FOREIGN PATENT DOCUMENTS

| 63-124412 | 5/1988 | Japan . |
| 0218019 | 8/1989 | Japan . |
| 3-138920 | 6/1991 | Japan ............... 257/797 |
| 3-161919 | 7/1991 | Japan ............... 257/797 |

*Primary Examiner*—David B. Hardy
*Attorney, Agent, or Firm*—Oblon, Spivak, McClelland, Maier & Neustadt, P.C.

[57] ABSTRACT

An alignment mark formed on a surface of substrate for aligning with a mask through an irradiation of alignment light, which comprises a step formed with a concave portion and a convex portion and a metallic film deposited along the concave portion and the convex portion. A light absorption layer is formed over at least one of the concave portion and the convex portion reflecting the step, the light absorption layer lying over the concave portion having a different thickness from that of the light absorption layer lying over the convex portion when the light absorption layer is formed over both the concave portion and the convex portion, the light absorption layer comprising a material capable of absorbing at least a portion of wavelength region of the alignment light. The light absorption layer is desirably formed in a larger thickness on the convex portion of the step as compared with that on the concave portion. Desirably, the light absorption layer is a resist capable of absorbing a portion of wavelength region of the alignment light, or a resist containing a material capable of absorbing a portion of wavelength region of the alignment light.

3 Claims, 11 Drawing Sheets

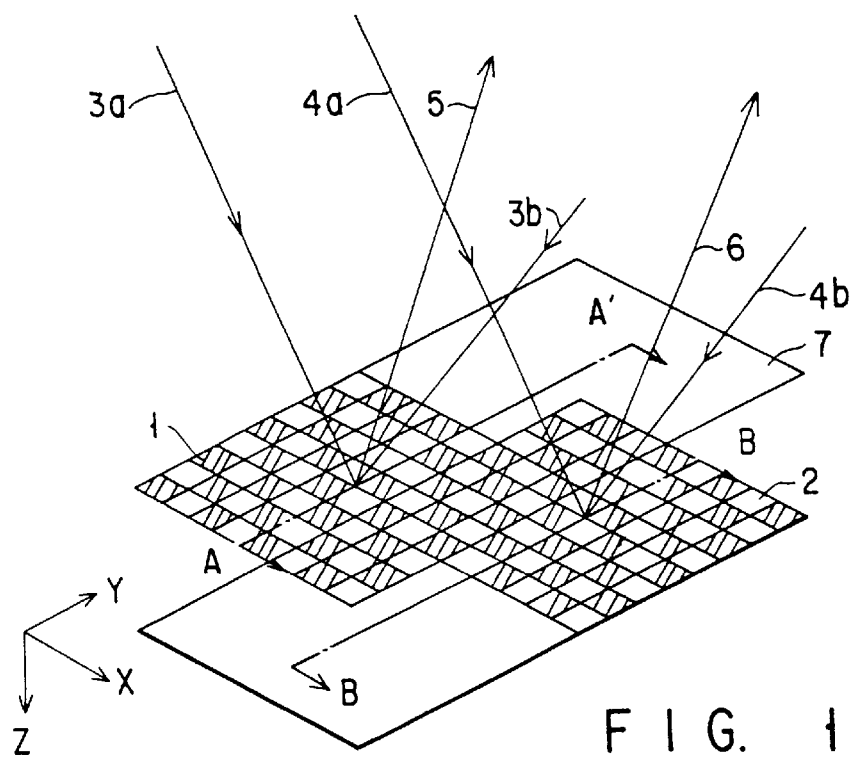
F I G. 1

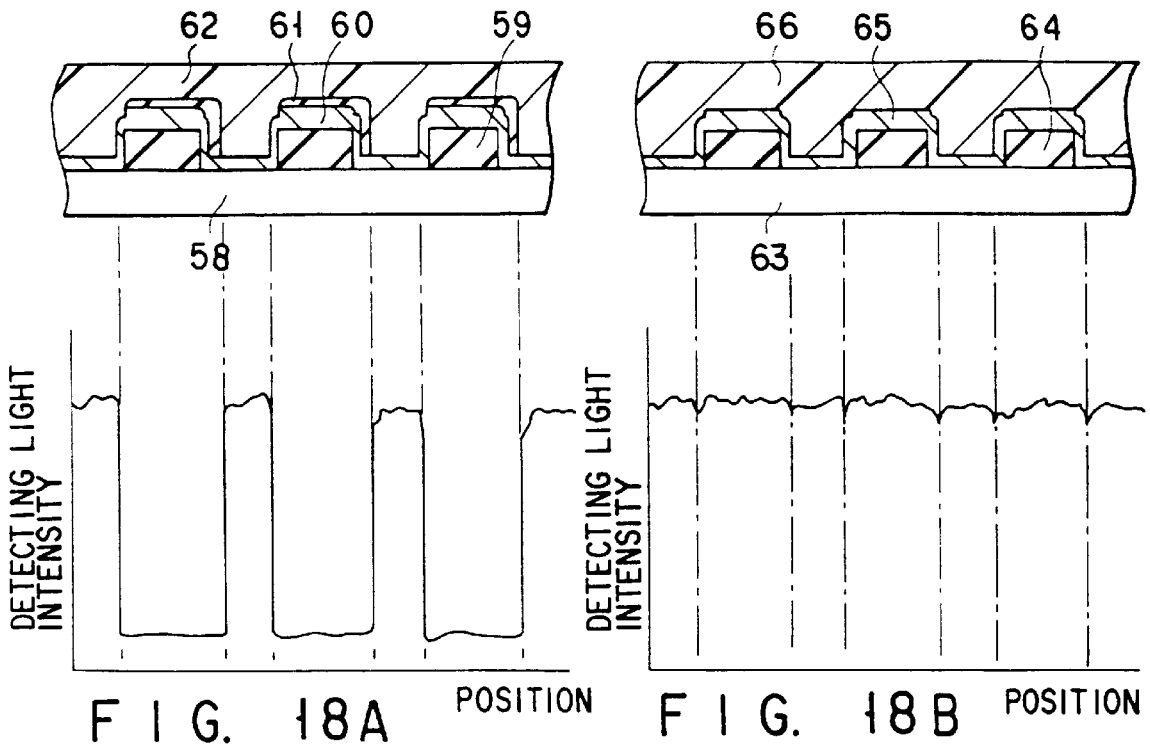
FIG. 18A
FIG. 18B
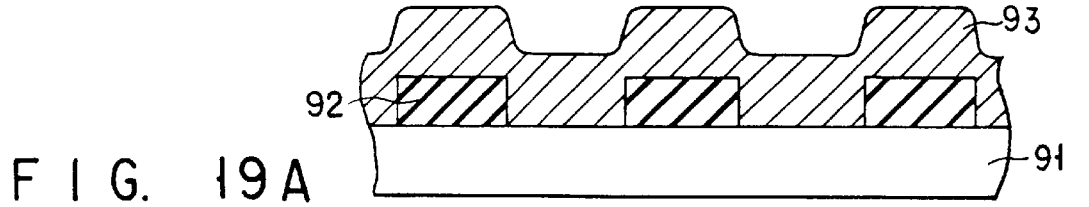
FIG. 19A
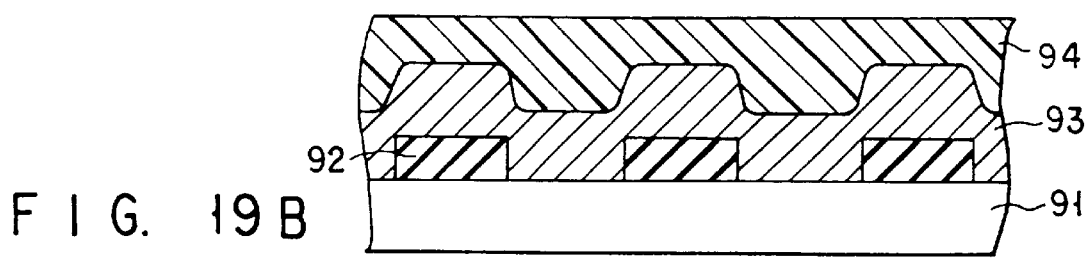
FIG. 19B
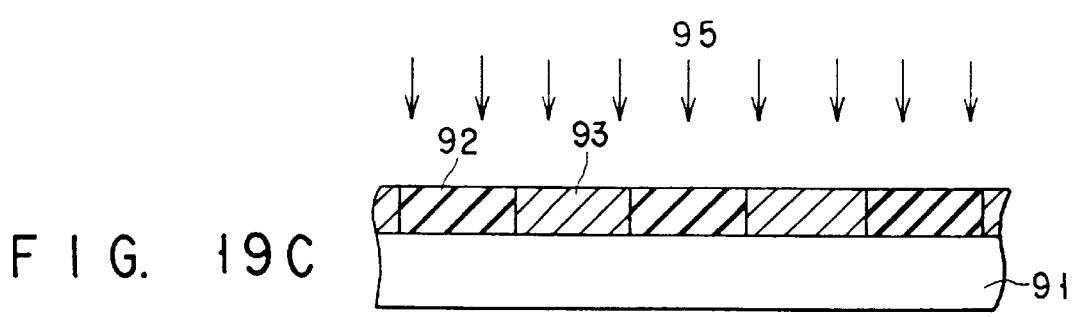
FIG. 19C

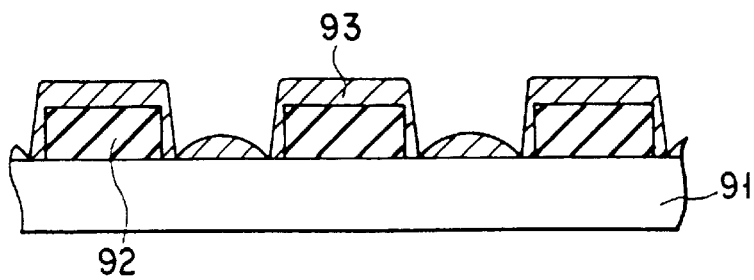
F I G. 20A
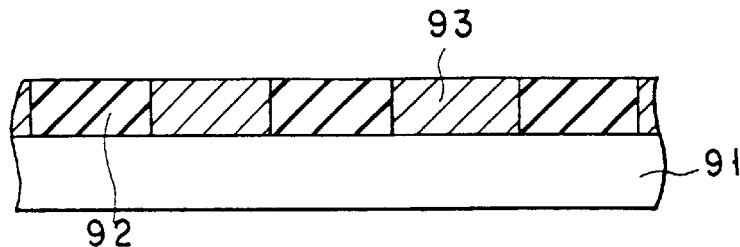
F I G. 20B
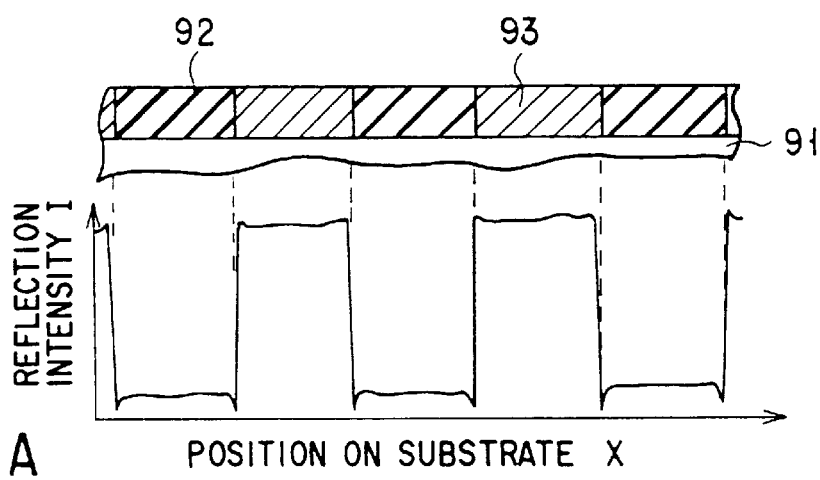
F I G. 21A
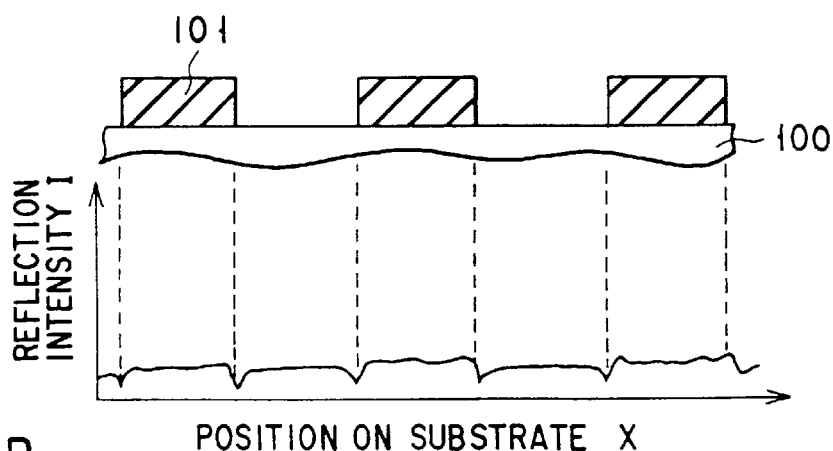
F I G. 21B

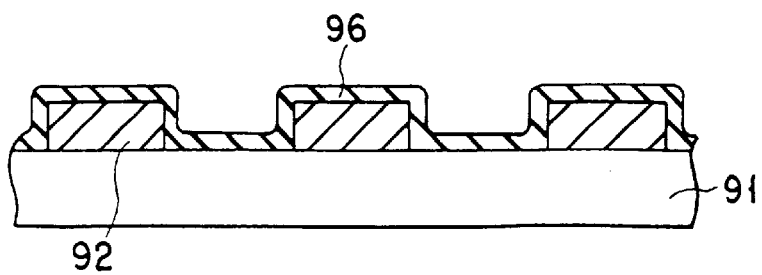
F I G. 22A
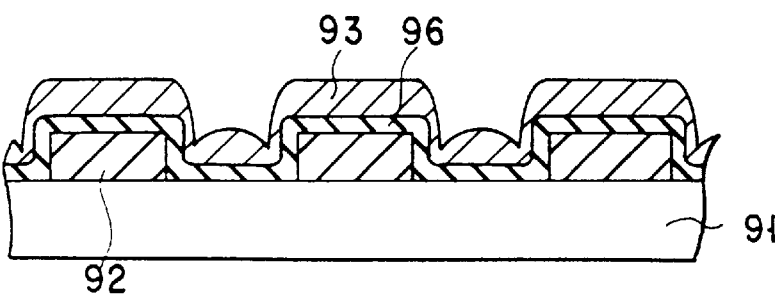
F I G. 22B
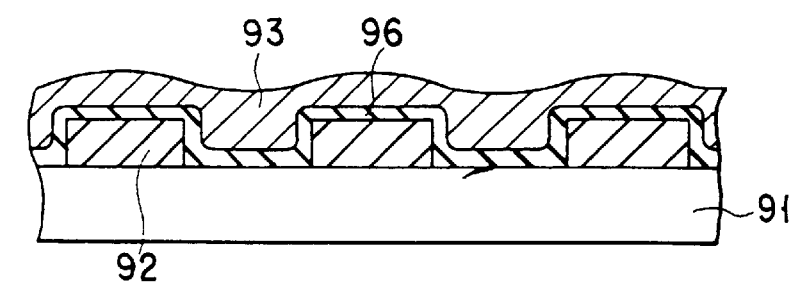
F I G. 22C
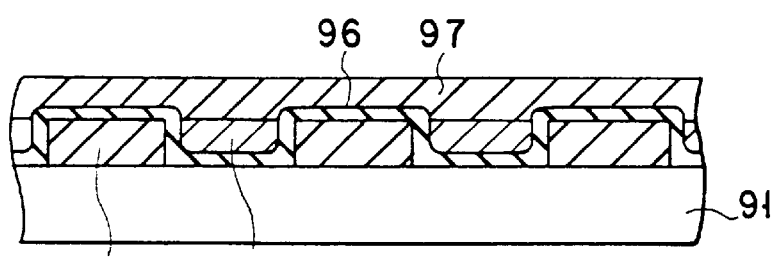
F I G. 22D
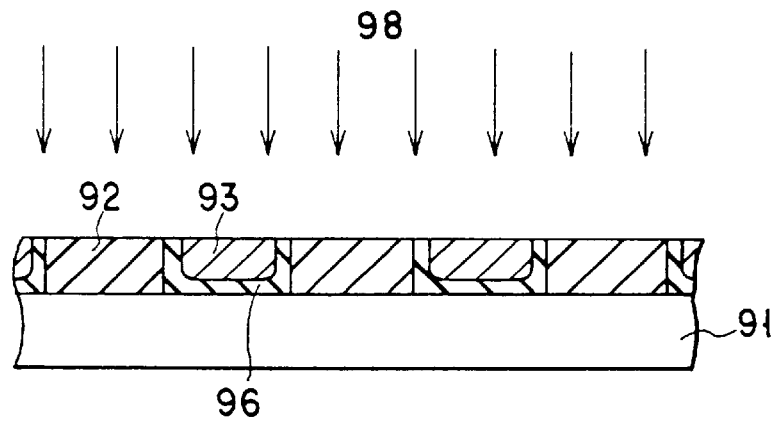
F I G. 22E

ALIGNMENT MARK, MANUFACTURING METHOD THEREOF, EXPOSING METHOD USING THE ALIGNMENT MARK, SEMICONDUCTOR DEVICE MANUFACTURED USING THE EXPOSING METHOD

This application is a Division of application Ser. No. 08/873,563 filed on Jun. 12, 1997 now U.S. Pat. No. 5,847,468, which is a Continuation of Ser. No. 08/536,266 filed on Sep. 29, 1995 which is abandoned.

BACKGROUND OF THE INVENTION

1. Field of the Invention

This invention relates to an alignment mark useful in the formation of pattern using typically a lithography technique in the process of manufacturing a semiconductor device, in particular to an alignment mark to be used in the formation or processing of a resist pattern and to the manufacturing method of the alignment mark.

Further, this invention relates to an exposing method using the above mentioned alignment mark and to a semiconductor device to be manufactured using the exposing method.

2. Description of the Related Art

In the manufacture of semiconductor device, miniaturization of unit structure (cell) constituting the device contributes to the saving of manufacturing cost of the device of high performance and large scale. In an effort for realizing the miniaturization of cell, the parties concerned to the manufacture of semiconductor device are making an extensive effort on the technique and research of semiconductor device.

In order to realize the fine working of the device cell, it is imperative to improve working techniques such as an anisotropic etching to the vertical direction. Additionally, a further development of technique with respect to fine resist-patterning such as an optical lithography is also demanded.

Regarding the formation of resist pattering, the resolution can be improved by the following techniques. First, it is desired to select as an exposure light a ray of shorter wavelength such as g-line, i-line, extreme ultraviolet ray. It is also possible to improve the resolution by using an improved irradiation method, such as a converted irradiation. Now, owing to the development of a photomask which capable of controlling not only the distribution in intensity of transmitted light but also the phase of light, the resolution of pattern is becoming more improved.

Additionally, it is also required in order to achieve a fine patterning a mask pattern over a pattern preliminarily formed on the surface of underlying substrate with accuracy. Namely, a high accurate alignment is required. For the purpose of achieving this high accurate alignment, alignment systems of various type have been developed.

There are two typical alignment systems, i.e., a system wherein the alignment is individually performed to each exposure area which has been formed in advance by dividing a substrate into several chips; and a system wherein the alignment is performed all over the substrate at first, and exposure is performed on all exposure area. According to the former system, each exposure area formed by dividing a substrate into several chips is provided with alignment marks, so that the alignment between a mask and a chip is performed by detecting the location of the alignment marks immediately before irradiating an exposure light to each chip. Subsequently, an alignment light for transferring the mark pattern to the substrate is sequentially moved to the exposure area of each chip thereby performing the exposure.

On the other hand, according to the latter system, the alignment mark is put on two or more locations of the substrate. In an operation of aligning a mask with a substrate, a stage carrying substrate is moved to a mark-detecting position to sequentially detecting the alignment marks, and then on the basis of the extent of movement of the stage, the alignment between the mask and the substrate as a whole is performed. Subsequently, the exposure all over the exposure area of substrate is performed.

In detecting the location of alignment mark, an optical detecting system instead of a needle-contacting system is generally employed. Accordingly, in this respect, the above mentioned two alignment exposure systems belong to the same optical alignment system.

An optical alignment system generally employed is an image processing method, which can be performed as follows. Namely, in one method an alignment light is first irradiated onto the regions of alignment marks on a mask and substrate. Then, the intensity profile of reflected light or transmitted light of the alignment light irradiated to the mask and substrate is measured with an area sensor. In another method, a mask alignment mark and a substrate alignment mark are first scanned with focusing alignment light. Then, an intensity change of scattered light of the alignment light scanning the mask mark and the substrate alignment mark is measured with a detector. From this intensity profile thus obtained, a waveform corresponding to the mark per se or the step of the mark is detected, and then the location of the mark is measured on the basis of the waveform. After measuring the locations of mask mark and the substrate (wafer) mark, the magnitude of relative misregistration between these marks is determined on the basis of the measured locations.

Recently, a new alignment method called "heterodyne method" using diffraction light of alignment light has been put into practical use. According to this heterodyne method, a mask and a substrate, each having a diffraction grid pattern or checkerwise lattice pattern as an alignment mark, are employed, and an alignment light is irradiated to the mask and substrate to detect a diffraction light. Based on the phase of this detected diffraction light, the magnitude of relative misregistration between the mask and substrate is measured.

These optical alignment methods may be applied to a substrate with high reflectivity such as a substrate covered with a metallic film such as aluminum film, a substrate having a transparent material layer on a metallic film mentioned above, or a substrate having alignment marks of a transparent material formed on a metallic film mentioned above. There is a problem however that when these optical alignment methods is applied to a substrate with high reflectivity as mentioned above, the alignment accuracy becomes much lowered as compared with a substrate with low reflectivity such as a LOCOS substrate or a gate substrate.

Specifically, in the case of a substrate with high reflectivity having a metallic film on its top surface, the reflectance of convex portion or concave portion constituting an alignment is almost the same as that in the periphery thereof, and the reflection intensity is highly influenced by the surface roughness of metallic film. Accordingly, when an image processing treatment is performed on a high reflectance substrate, only a reflection intensity profile of large noise can be obtained, causing a waveform corresponding to the step of the mark to be buried within the noise. Therefore, it is quite difficult to detect the waveform corresponding to the step of the mark from the reflection intensity profile, thus resulting in the lowering of alignment accuracy.

On the other hand, in the case of performing the positional detection from the data on intensity or phase of diffracted light, the changes of intensity or phase due to differences in the height of step or in cross-sectional shape may be caused to increase, if the difference in reflectance between the convex portion and the concave portion is small, thus giving rise to the generation of random offset portion in the measured value in each alignment mark.

Followings are explanations on the problem of lowering of alignment accuracy in a high reflectance substrate. As one example of using heterodyne method for a high reflectance substrate, X-rays proximity lithography was employed. In the heterodyne alignment method using X-rays proximity lighography, there is another problem in addition to the problems mentioned above that a multiple reflection of alignment light to be generated between the substrate and mask tends to become more conspicuous when a high reflectance substrate is used, thus making it one of reasons for the degradation of accuracy.

FIG. 1 illustrates a schematic view of an alignment system. FIG. 2 shows an incident light projected onto the marks of the mask and substrate; and a diffracted light from these marks.

In the alignment using the system shown in FIG. 1, HeNe laser beams 3a and 3b are projected onto the mask alignment mark 1 at same incident angle in XZ plane. Additionally, HeNe laser beams 4a and 4b are projected onto the substrate mark 2 at the same incident angle as mentioned above in XZ plane. Thereafter, the phase difference between a detecting light 5 diffracted at plus first order direction in YZ plane at the mask alignment mark and the detecting light 6 diffracted at plus first order direction in YZ plane at the substrate mark 2 is measured, and then the registration between the mask and the substrate is adjusted. Namely, an accurate measurement of a phase difference between the light 5 detected from the mask mark and the light 6 detected from the alignment mark leads to the improvement of alignment accuracy.

However, according to this system, multiple reflection 14 and 14a will be caused to generate between the mask 8 and the substrate 9 as shown in FIG. 2, so that disturbance light 11 and 12 will be generated. The disturbance light 11 is mingled with the light 5 detected from the mask mark and the disturbance light 12 is mingled with the light 6 detected from the alignment mark. If such a disturbance light is mingled with the detected light, the signal accuracy of alignment will be deteriorated.

The multiple reflection 14a can be vanished by providing a shade film 10 to the mask, so the mingling of the disturbance light 11 with the detected light 5 is prevented.

The influence of this disturbance light on the detected light 6 can be confirmed by measuring the noise to be generated when only GAP (a space between the mask and the substrate) is caused to change. Changing only of GAP can be effected for example by moving a substrate stage in Z direction while preventing the mask and substrate stages from being moved in XY direction. FIG. 3 illustrates the generation of noise at a cycle of $\lambda/2$ ($\lambda$: wavelength of HeNe laser) in an alignment signal which originally should be indicating a constant value. When this amplitude in intensity of the detected light is converted to misregistration of alignment, it corresponds to 0.1 $\mu$m or more of misregistration. From this fact, it can be seen that if an disturbance light is mingled with the detected light, it is no more possible to accurately measure the position of the mark.

In an ordinary exposure method other than the X-ray proximity lighography, it can be generally said that a delicate non-uniformity in the cross-sectional shape of alignment mark also tends to become a cause for the deterioration in alignment accuracy. This problem will be discussed below.

In the case of a high reflectance substrate, the reflectance of convex portion of an alignment mark is almost the same as that of concave portion because of its low transmittance. Additionally, the reflectance of the side wall of the mark also is almost the same with those of the convex and concave portions. Therefore, the phase of diffracted light is much influenced by the change in cross-sectional shape of the mark. In the heterodyne method where the detection of relative misregistration between the mask and the substrate is performed according to the phase, any change in cross-sectional shape of mark may be a cause of deterioration in alignment accuracy.

As explained above, when an alignment method generally employed in the formation of pattern is applied to a high reflectance substrate having a metallic film such as aluminum film deposited thereon, only an alignment of very poor accuracy is obtainable as compared with a low reflectance substrate according to the technical level of today. Therefore, in the manufacture of a semiconductor device using a metallic film such as aluminum film for the formation of metallic wiring, it is required for the purpose of improving alignment accuracy to take countermeasures such as thickening the wiring; increasing the number of wiring; or increasing the manufacturing steps for forming the wiring.

The problems pertinent to a high reflectance substrate have been explained in the above description. However, it is also difficult to obtain an alignment signal of high signal to noise ratio (S/N) in the case of performing an alignment between an underlying substrate of very low reflectance and a mask. Therefore, it is also difficult to obtain an alignment of satisfactory accuracy in this case.

In the occasion of applying an image processing treatment using a reflected light to an underlying substrate of low reflectance, an alignment light is first irradiated onto the substrate thereby obtaining a reflection intensity profile. Then, the location of mark is detected from the minimum value of reflection intensity appearing near the vicinity of the step of the alignment mark, thereby performing the alignment of it with the mask. However, in the case of low reflectance substrate, the reflection intensity of the background is very low so that its minimum value is caused to disappear, thereby making it difficult to detect even the location of mark.

As explained above, when the image processing treatment is applied to a high reflectance underlying substrate, the S/N ratio of alignment is caused to be much deteriorated as compared with other kinds of underlying substrate. In particular, in the case of the manufacturing process of semiconductor device, the formation of a metallic wiring would be very difficult or complicated.

On the other hand, in the case of low reflectance underlying substrate, it is conceivable, for the purpose of improving alignment accuracy, to improve the optical alignment system or the resolution of a detecting device. However, nothing have been successful to achieve such an improvement up to date.

SUMMARY OF THE INVENTION

Therefore, an object of this invention is to provide an alignment mark and the manufacturing method thereof which is capable of increasing S/N ratio of alignment detecting signal and achieving a high accuracy alignment over a high reflectance underlying substrate.

Further object of this invention is to provide an exposure method using this alignment mark, and a semiconductor device to be manufactured using this exposure method.

Still another object of this invention is to provide an alignment mark and the manufacturing method thereof, through use of the conventional alignment apparatus, which is capable of increasing S/N ratio of alignment detecting signal and achieving a high accuracy alignment over a low reflectance underlying substrate which is inherently poor in alignment accuracy.

Namely, according to the present invention, there is provided an alignment mark for aligning with a mask through an irradiation of alignment light, which comprises a step formed with a concave portion and a convex portion, the mark being formed on a surface of a substrate, and a metallic film deposited along the concave portion and the convex portion of the step, wherein a light absorption layer is formed over at least one of the concave portion and the convex portion reflecting the step, the light absorption layer lying over the concave portion having a different thickness from that of the light absorption layer lying over the convex portion when the light absorption layer is formed over both the concave portion and the convex portion, the light absorption layer comprising a material capable of absorbing at least a portion of wavelength region of the alignment light.

This invention further provides an alignment mark for aligning with a mask through an irradiation of alignment light, which comprises a step formed with a concave portion and a convex portion, the mark being formed on a surface of a substrate, wherein a light-reflecting layer is formed over at least one of the concave portion and the convex portion, the light-reflecting layer lying over the concave portion having a different thickness from that of the light-reflecting layer lying over the convex portion when the light-reflecting layer is formed over both the concave portion and the convex portion, the light-reflecting layer having a higher reflectance than that constituting the mark with respect to at least a portion of wavelength region of the alignment light.

The alignment mark according to this invention can be manufactured by a method comprising the steps of;

preparing a substrate provided on its surface with an alignment mark for aligning with a mask through an irradiation of alignment light, the mark comprising a step formed with a concave portion and a convex portion, and with a metallic film deposited along the concave portion and the convex portion of the step; and forming a light absorption layer over at least one of the concave portion and the convex portion reflecting the step, the light absorption layer lying over the concave portion having a different thickness from that of the light absorption layer lying over the convex portion when the light absorption layer is formed over both the concave portion and the convex portion, the light absorption layer comprising a material capable of absorbing at least a portion of wavelength region of the alignment light.

Further, the alignment mark according to this invention can be manufactured by a method comprising the steps of;

preparing a substrate provided on its surface with an alignment mark for aligning with a mask through an irradiation of alignment light, the mark comprising a step formed with a concave portion and a convex portion; and forming a light reflective layer over at least one of the concave portion and the convex portion reflecting the step, the light reflective layer lying over the concave portion having a different thickness from that of the light reflective layer lying over the convex portion when the light reflective layer is formed over both the concave portion and the convex portion, the light reflective layer comprising a light reflective material having a higher reflectance than a material constituting the mark to at least a portion of wavelength region of the alignment light.

According to this invention, there is further provided a light exposure method, which comprises the steps of;

preparing a substrate provided on its surface with an alignment mark comprising a step formed with a concave portion and a convex portion, with a metallic film deposited along the concave portion and the convex portion of the step, and with a resist film formed at least on the metallic film;

performing an alignment between the substrate and a mask by irradiating an alignment light to the alignment mark of the substrate and to the mark of mask from a light source for alignment after positioning the mask having a prescribed pattern and mark above the substrate; and transferring the pattern on the mask to the resist film deposited on the substrate, wherein the alignment is performed using reflected light, scattered light or diffracted light from at least a portion of the alignment mark, and reflected light, scattered light or diffracted light from the mark of mask; and the alignment mark of the substrate comprises a light absorption layer formed over at least one of the concave portion and the convex portion reflecting the step, the light absorption layer lying over the concave portion having a different thickness from that of the light absorption layer lying over the convex portion when the light absorption layer is formed over both the concave portion and the convex portion, the light absorption layer comprising a material capable of absorbing at least a portion of wavelength region of the alignment light.

According to this invention, there is further provided a semiconductor device, which comprises an underlying substrate having a device region and an alignment mark region on its surface;

a metallic wiring formed on the device region of the substrate; and an alignment mark formed on the alignment mark region of the substrate, wherein the metallic wiring is formed by the steps of:

preparing a substrate provided on its surface with the alignment mark, with a metallic film deposited along a shape of the alignment mark, and with a resist film formed at least on the metallic film;

positioning a mask having a prescribed device pattern and another alignment mark above the substrate by aligning the alignment mark of the substrate and the alignment mark of the mask;

transferring the device pattern on the resist film to form a resist pattern; and etching the metallic film using the resist pattern as an etching mask, the alignment being performed by first irradiating alignment light to the alignment mark and to the mark of mask from a light source for alignment, and by making use of reflected light, scattered light or diffracted light from at least a portion of the alignment mark, and reflected light, scattered light or diffracted light from the mark of mask; and the alignment mark of the substrate comprising a light absorption layer formed over at least one of the concave portion and the convex portion reflecting the step, the light absorption layer lying over the concave portion having a different thickness from that of the light absorption layer lying over the convex portion when the light absorption layer is formed over both the concave portion and the convex portion, the light absorption layer comprising a material capable of absorbing at least a portion of wavelength region of the alignment light.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view schematically illustrating an alignment system used in this invention as well as in the prior art;

FIGS. 18A and 18B shows respectively a graph showing signals detected in Example 1-6 and in the prior art;

FIGS. 19A, 19B and 19C shows respectively a sectional view illustrating the manufacturing method of alignment mark of Example II-1;

FIGS. 20A and 20B shows respectively a sectional view illustrating the manufacturing method of alignment mark of Example II-2;

FIGS. 21A and 21B shows respectively a reflection intensity profile of an alignment signal;

FIGS. 22A to 22E shows respectively a sectional view illustrating the manufacturing method of alignment mark of Example II-3;

DETAILED DESCRIPTION OF THE PREFERRED EMBODIMENTS

Figure 2:
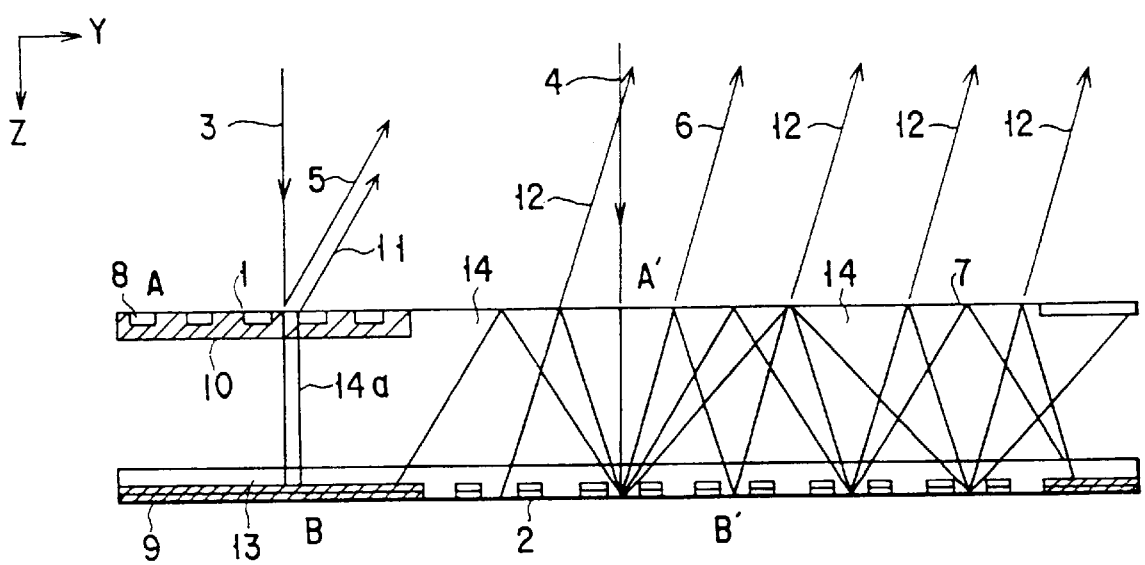
FIG. 2 is a cross-sectional view schematically showing passages of light through mask and substrate used in Example I-1 and in the prior art.

This invention will be further explained with reference to the following preferred embodiments.

When a substrate having a high reflectivity to an alignment light is to be exposed to the alignment light, a layer of a material capable of absorbing at least a portion of wavelength region of the alignment light is formed over at least one of the concave portion and convex portion constituting an alignment mark formed on the substrate, the light absorption layer lying over the concave portion having a different thickness from that of the light absorption layer lying over the convex portion when the light absorption layer is formed over both the concave portion and the convex portion. With this construction, it is possible to enhance the contrast of the alignment mark, thereby remarkably improving the accuracy of the alignment-detecting signal.

In particular, when this construction is applied to the transfer of resist pattern in the formation of metallic wirings, any of the conventional measures such as thickening of wiring, increasing in number of wiring or increasing in number of manufacturing steps may not be required. Therefore, it is possible to decrease the number of manufacturing steps for the formation of wiring, and at the same time, to manufacture a semiconductor device extremely integrated and having high reliability even if the minimum line width is the same as that of the conventional wiring.

On the other hand, when a substrate having a low reflectivity to an alignment light is to be exposed to the alignment light, a layer of a material having a higher reflectance to the alignment light is formed over at least one of the concave portion and convex portion constituting an alignment mark formed on the substrate, the light-reflecting layer lying over the concave portion having a different thickness from that of the light-reflecting layer lying over the convex portion when the light-reflecting layer is formed over both the concave portion and the convex portion, thereby increasing the reflectance ratio of the mark portion.

When a high-reflectivity material is disposed on any of the concave portion and convex portion constituting an alignment mark, the reflectance of a portion disposed with this high-reflectivity material can be selectively increased. When a high-reflectivity material is disposed all over the alignment mark region, the reflectance ratio between the concave portion and the convex portion can be increased by smoothly depositing a material capable of absorbing an alignment light on this high-reflectivity material.

Therefore, it is possible to increase the reflectance ratio of the region disposed with this high-reflectivity material, to intensify alignment signals to be detected, and to remarkably improve the S/N ratio.

Namely, it is now possible according to this invention to improve the S/N ratio of alignment signals and to enhance the alignment accuracy irrespective of a substrate to be employed, i.e., even a high-reflectivity substrate or a very low-reflectivity substrate.

This invention will be further described in detail as follows.

An alignment mark according to this invention for improving an alignment accuracy in the use of a substrate having a high reflectivity to an alignment light is constructed such that a layer of a material capable of absorbing at least a portion of wavelength region of the alignment light is formed over at least one of the concave portion and convex portion constituting a step of an alignment mark, the light absorption layer lying over the concave portion having a different thickness from that of the light absorption layer lying over the convex portion when the light absorption layer is formed over both the concave portion and the convex portion. When it is desired to dispose a large amount of the light-absorbing material on the concave portion rather than the convex portion of the step, it is possible to use as this material a resist containing therein an absorbent capable of absorbing a light of specific wavelength, or a resist inherently having a characteristic of absorbing a light of specific wavelength.

For such an absorbent, any desired absorbent may be employed depending on the kind of alignment light. For example, anthraquinone-based dyestuff, or disazo-based dyestuff may be employed. As for the resist inherently absorbing a light of specific wavelength, a resist for i-line containing a novolak resin and naphthoquinone-based compound may be employed.

When a dyestuff is to be incorporated into a resist, the dyestuff may be preferably added at a ratio of 0.1 to 5.0% by weight to the resist. If the ratio is less than 0.1% by weight, it would be difficult to expect a sufficient absorbing effect. On the other hand, if the ratio exceeds over 5.0% by weight, precipitation of the dyestuff or the deterioration in shape of the resist being transferred would be caused.

As examples of anthraquinone-based dyestuff, the compounds represented by the following general formula (I) may be employed.

Formula (I)

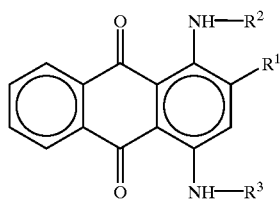

wherein $R^1$ is hydrogen atom, hydroxyl group or a halogen atom; $R^2$ and $R^3$ may be the same or different and are individually hydrogen or a functional group selected from the group shown below; and $R^4$ is hydrogen or hydroxyl group;

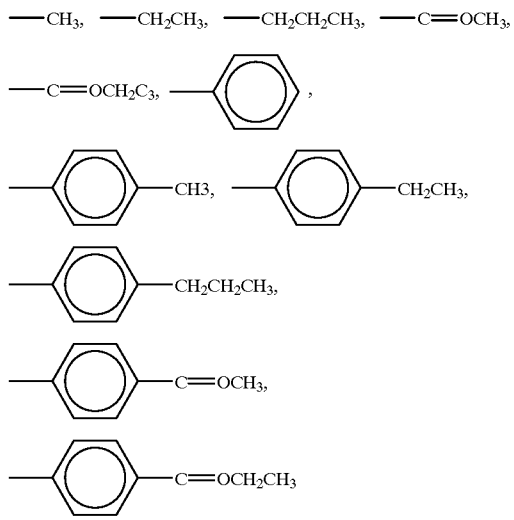

This anthraquinone-based dyestuff has an absorption wavelength in the vicinity of 640 nm, so that it is very effective as an absorbent to the light of 600–650 nm in wavelength, such as HeNe laser beam. Moreover, since the melting point of this anthraquinone-based dyestuff is 215 to 217° C., this dyestuff is stable even in heat treatments to be conducted before or after the light exposure.

As an example of a resist containing a novolak resin and naphthoquinone-based compound, an ordinary resist for i-line may be used. For example, TSCR-97 (Tokyo Ouka Co. Ltd.) may be employed. Since the resist for i-line mentioned above has an absorption region in the wavelength region of 400–500 nm, it is very effective as an absorbent to the light of 400–500 nm in wavelength, such as HeCd laser beam.

As for disazo-based dyestuff, the compounds represented by the following general formula (II) may be employed.

Formula (II)

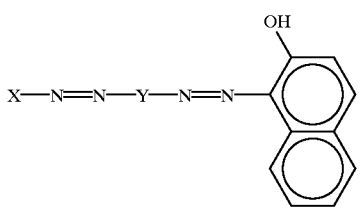

wherein X is a substituent group selected from the group "a" mentioned below; Y is a substituent group selected from the group "b" mentioned below.

group a

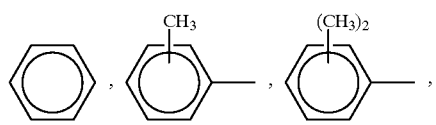

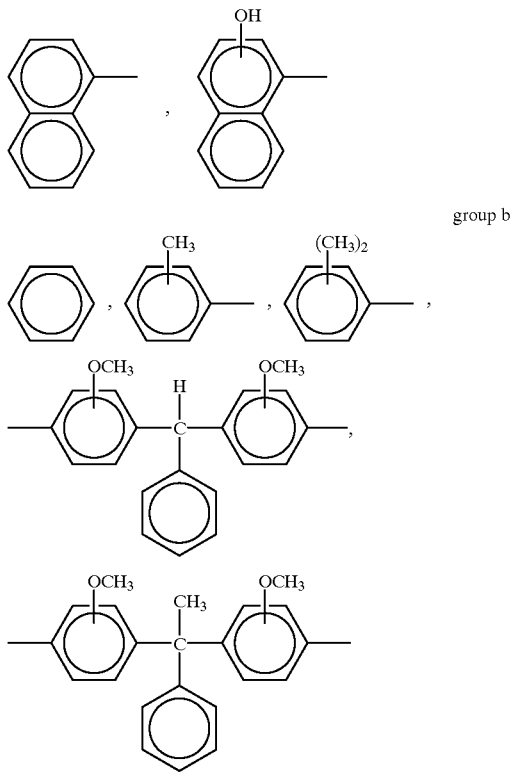

group b

This disazo-based dyestuff has an absorption region in the vicinity of 510 nm, so that it is very effective as an absorbent to the light of 500–550 nm in wavelength, such as Ar laser beam. Moreover, since the melting point of this disazo-based dyestuff is 184 to 185°C., this dyestuff is stable even in heat treatments to be conducted before or after the light exposure.

As for a resist to be used with an anthraquinone-based dyestuff or disazo-based dyestuff contained therein, a resist which is photosensitive to i-line, deep UV or radioactive rays may be used.

The deposition of a high-absorbing material mentioned above on at least concave portion may be performed as follows.

First, a high-absorbing material is deposited all over the alignment mark, and then the light-absorbing material is removed until the surface of the convex portion of the mark is exposed, thereby disposing the light-absorbing material on the concave portion. By the way, there is no need to completely remove the light-absorbing material from the upper surface of the convex portion of mark, but part of the light-absorbing material may be left thereon, provided it is capable of detecting a signal intensity from the convex portion. Specifically, when the linear absorption coefficient of the light-absorbing material is about 3 $\mu m^{-1}$, the signal intensity can be detected from the convex portion of the mark even if the convex portion is covered with 0.7 $\mu m$ in thickness of the light-absorbing material.

When the light-absorbing material coated on the mark is to be partially removed so as to leave the light-absorbing material deposited on a prescribed region of the convex and concave portions, it is not required to perform the removing treatment in a manner to make flat the resultant surface. As mentioned above, the purpose of this invention is to increase the difference in reflectance between the concave portion and the convex portion of the alignment mark. Namely, if the light-absorbing material is disposed only on the concave portion of the mark, the absorbency of this concave portion becomes large thereby attaining the object of the invention. Therefore, there is no need in view of achieving the purpose of this invention to flatten the surface to be obtained.

The deposition of the light-absorbing material can be performed by a spin coating method or a sputtering. The removal of the light-absorbing material thus deposited can be performed by an etching treatment or by an abrasion treatment.

The removal of the light-absorbing material may be performed by preliminarily depositing an etching-assistant on the layer of the light-absorbing material before removing the light-absorbing material deposited all over the alignment mark, and then by etching the light-absorbing material.

After depositing the light-absorbing material all over the alignment mark, a specific kind of ultraviolet rays may be irradiated onto the light-absorbing material to such a depth as to reach the surface of the convex portion of the mark thereby performing a clarifying treatment, thus lowering the absorbency to the alignment light. There is substantially no restriction as to the light-absorbing material to be deposited, and thickness of the light-absorbing material may be suitably selected depending on the intensity of ultra-violet rays to be employed.

It is also possible to employ as a light-absorbing material a material which can be softened at a specific temperature. In this case, this softening material is coated all over the alignment mark region, and then this coated softening material is subjected to heat treatment thereby allowing the material coated on the surface of the convex portion to flow into the concave portion thereby disposing the softening material on the concave portion of the mark. As an example of the softening material, a resin such as a carbon resin may be used.

In the above explanation, an example where a light-absorbing material is deposited at least on the concave portion of the step of the alignment mark is explained. However, when it is desired to dispose a larger amount of the light-absorbing material on the concave portion rather than the convex portion of the step, the following method may be employed. For example, after coating a light-absorbing material all over the step, the light-absorbing material disposed over the convex portion of the step is selectively removed using an etching method or a abrasion method. In this case, a clarifying treatment may be conducted to the surface of the alignment mark. Alternatively, the light-absorbing material disposed all over the step may be softened so as to cause the light-absorbing material disposed on the convex portion to flow into the concave portion. It is also possible to increase the absorbency of the concave portion to the alignment light by performing an opacifying treatment to a transparent material which has been preliminarily disposed on the concave portion in a larger amount than on the convex portion of the step.

This opacification may be conducted by performing a treatment such as a hard bake to a transparent material such as a resist which has been disposed on the concave portion in a larger amount than on the convex portion of the step.

Through such treatments as explained above, it is possible to leave a larger amount of light-absorbing material on the concave portion in the step of the alignment mark.

The deposition of a larger amount of light-absorbing material on either the concave portion or the convex portion of the alignment mark than the other can be performed using a converging light or a converging charged particle beam. For example, FIB (Focused Ion Beam) Deposition or IBS (Ion Beam Sputter) Deposition may be used for forming a carbon film.

This method will be explained in more detail as follows. First, an alignment mark is covered with a mask plate having an opening. Then, a material capable of absorbing a light of a portion of the wavelength region of alignment light is scattered down to the mask plate at a prescribed angle thereby forming a carbon film on a prescribed portion of the mark region. Alternatively, an alignment mark region is first covered with a mask. Then, charged particle beam is irradiated to the mask region at a prescribed angle in a prescribed gas atmosphere thereby forming a carbon film on a prescribed portion of the mark region.

The alignment mark having a light-absorbing layer prepared in this manner is capable of improving an alignment accuracy in a resist pattern transferring using a resist for extreme ultraviolet.

The alignment mark of this invention can be employed in an exposure process wherein an alignment is performed by using a reflected light, scattered light or diffracted light of alignment light irradiated from a light source to a mark.

The exposure process of this invention can be applied to the manufacture of all kinds of semiconductor device wherein a metallic wiring is formed in accordance with the following steps. Namely, the steps of manufacturing a metallic wiring comprises; a step of forming a metal film all over an underlying substrate having an alignment mark constituted by a step comprising a concave portion and convex portion, thus obtaining the metal film reflecting the rugged features of the step; a step of forming a resist film over the underlying substrate covered with the metal film; a step of disposing a mask having a prescribe pattern over the underlying substrate in alignment with the underlying substrate; a step of forming a resist pattern by transferring the pattern of the mask to the resist film; and a step of etching the metal film using the resist pattern being used as a mask, thereby obtaining a metallic wiring.

This invention can be effectively utilized for performing an accurate alignment between a mask and a substrate in the formation of a metallic wiring.

In the followings, an alignment for improving the alignment accuracy in the employment of a low reflectance substrate will be explained in detail.

In order to improve the alignment accuracy in the employment of a low reflectance substrate, a material having a high reflectance is disposed in a prescribed region of the step of the alignment mark formed in advance on a substrate to be exposed. As for the material having a high reflectance, any desired material would be used as far as the material has a high Fresnel's reflectance and exhibits a large absorbency to an alignment light. For example, aluminum or tungsten can be used.

According to this invention, it is preferable to make the reflectance ratio between the concave portion and the convex portion of the mark on the substrate to become twice or more by disposing an aforementioned high reflectance material on a prescribed region of the concave portion or the convex portion of the mark on the substrate. The higher the reflectance ratio is, the larger is the S/N ratio of the alignment signal to be obtained. In the image-processing method or heterodyne method, the S/N ratio of the alignment signal increases in proportion to the reflectance ratio.

In the alignment exposure method using the alignment mark of this invention, a substrate having a high-reflective material disposed on (1) only the concave portion of the mark on the substrate; (2) only the convex portion of the mark on the substrate; or (3) both of the concave and convex portions of the mark on the substrate may be used.

The deposition of a high-reflective material on only the concave portion may be performed as follows.

First, a high-reflective material is deposited all over the step, and then the high-reflective material disposed over the convex portion is removed through an etching or abrasion. Alternatively, the high-reflective material disposed all over the step may be softened so as to allowing the high-reflective material to flow into the concave portion.

To be more specific, the deposition of a high-absorbing material may be performed as follows.

First, a high-reflective material is deposited all over the concave and convex portions in the region of alignment mark, and then the high-reflective material is removed until the surface of the convex portion of the mark is exposed, thereby disposing the high-reflective material on the concave portion.

The deposition of the high-reflective material can be performed by a sputtering method, a CVD method or an electron beam vapor deposition method. The thickness of the high-reflective material layer may be suitably selected so as to exceed the level of the surface of the convex portion of the alignment mark on the substrate. However, in view of removing the high-reflective material layer on the convex portion of the mark in a subsequent step, the thickness of the high-reflective material layer may preferably be 1.2 to 2.0 times as large as the depth formed by the concave and convex portions of the mark.

The removal of the high-reflective mater al thus deposited can be performed by an etching or by a grinding.

As the concave portion of the alignment mark on the substrate is buried with a high-reflective material, the reflectance only of the concave portion is increased, thus causing the reflectance ratio between the concave portion and convex portion to increase. Namely, in the case of the image processing method, the S/N ratio of the alignment signal is increased through an increase in reflectance ratio as mentioned above; whereas in the case of the heterodyne method, the S/N ratio of the alignment signal is increased through an increase in diffraction efficiency.

The method mentioned above is particularly effective for a substrate where deterioration or non-uniformity of the sectional shape of the concave portion of the alignment mark is more greater than that of the convex portion. Namely, by covering a highly deformed concave portion with a high-reflective material, a noise in the alignment signal can be inhibited to a great extent.

It is possible in the process mentioned above to flatly deposit a to-be-etched film comprising a prescribed material as an etching-adjusting material on the substrate after the deposition of the high-reflective material on the substrate and before the removal of this high-reflective material. Any material may be employed as this to-be-etched film as long as the material has almost the same etching rate as that of high-reflective material. An example of such a to-be-etched film is a resist film. This to-be-etched film may be formed on the layer of high-reflective material by means of spin coating to a thickness of about 0.3 to 0.7 $\mu$m.

With this structure having the to-be-etched film being formed on the high-reflective material deposited on a substrate, it is possible to leave the high-reflective material on only the concave portion of the alignment mark by removing the to-be-etched film together with the high-reflective material deposited on the convex portion of the alignment mark. The removal of the to-be-etched film may be conducted by means of RIE (Reactive Ion Etching) using a predetermined gas.

The use of the to-be-etched film overlying the high-reflective material is also effective in enlarging the selectivity of the material useful for the high- reflective material.

Alternatively, it is also possible to dispose the high-reflective material on the concave portion of the alignment mark on a substrate. First, the high-reflective material is deposited all over the alignment mark to a thickness less than ½ of the height of the step. Then, the high-reflective material thus deposited on the convex portion of the mark is softened thereby allowing the high-reflective material to flow into the concave portion. When aluminum is employed as the high-reflective material, the high-reflective material can be caused to flow into the concave portion by heating it at a temperature of about 500° C.

On the other hand, if the high-reflective material is to be deposited only on the convex portion of the alignment mark on the substrate to be exposed, the following method can be employed. According to this method, a film consisting of a soluble material is selectively deposited only on the concave portion of the step, and then a light-reflective material is deposited all over the concave and convex portion of the mark. Then, the soluble material deposited on the concave portion is allowed to dissolve, and at the same time, the light-reflective material deposited on this concave portion is removed thereby leaving the light-reflective material only on the convex portion of the alignment mark.

This method is explained more detail as follows.

First of all, a soluble material is deposited all over the concave and convex portions of the alignment mark region, and then this soluble material is selectively removed thereby leaving a prescribed thickness of the soluble material remained only on the concave portion. In this case, it is required to completely remove the soluble material from the surface of the convex portion, and it is desirable that the height of a step to be formed between the surface of the soluble material remained on the concave portion and the surface of the convex portion is higher than the film thickness of a high-reflective material to be deposited in a subsequent step. The term of "soluble material" is defined to mean a material which can be dissolved without giving any bad influence to the substrate to be exposed as well as to the high-reflective material to be deposited on the substrate.

Then, a light-reflective material is deposited uniformly all over the convex portion of the mark and concave portion having the soluble material deposited thereon. Subsequently, the soluble material deposited on the concave portion is allowed to dissolve, thereby removing the light-reflective material depositing on the concave portion of the mark. As a result, the light-reflective material can be disposed only on the convex portion of the alignment mark.

It is preferable to use a resist as a soluble material, because a flat coated layer will be obtained by using the resist, and at the same time, it is possible to leave a prescribed thickness of the resist only on the concave cortion of the mark by subjecting the resist layer to an oxygen plasma etching. Moreover, the resist can be easily removed by using an organic solvent.

The method mentioned above is particularly effective for a substrate where the shape of the convex portion of the alignment mark is more deformed than that of the concave portion from an ideal shape, since the convex portion can be covered with a high-reflective material.

A method of increasing the reflectance ratio between the concave portion and the convex portion by depositing a high-reflective material all over the alignment mark on a substrate to be exposed will be explained as follows.

First, a high-reflective material is deposited all over the alignment marks on a substrate to be exposed by means of sputtering, thereby increasing the reflectance of the mark as a whole. In this occasion, the film thickness of the high-reflective material should preferably be at a level that the reflectivity is increased and sectional shapes are kept at the concave portion and the convex portion. For example, when aluminum is used as a high-reflective material, the film thickness of about 0.1 g m would be sufficient.

Subsequently, a light absorbent which is capable of absorbing an alignment light is deposited on the alignment mark in such a manner that the surface of the convex portion is completely covered with the light absorbent and that a flat coated surface will be resulted. As for the material for the light absorbent, a dyestuff which would not deteriorate the sensitivity and resolution of the resist can be employed. The amount of the light absorbent may be suitably selected.

When the alignment light is irradiated to the alignment mark thus prepared, the intensity of reflected light from the concave portion of the mark would be more weakened than that from the convex portion, since the light from the concave portion of the mark is required to go back and forth an extra distance of the step between the concave portion and the convex portion. Accordingly, it is possible to increase the reflectance ratio between the concave portion and the convex portion.

EXAMPLE

This invention will be further explained with reference to the following examples.

Example I

Example 1 describes an example of improving the accuracy of detecting the alignment mark formed on an underlying substrate of high reflectance.

Example I-1

With the use of X-ray proximity lithography, the alignment accuracy can be improved by disposing a resist containing a dyestuff at least on the concave portion of the alignment mark. The alignment system for use in the X-ray proximity lithography is illustrated in FIG. 1.

In the alignment using this system, HeNe laser beams 3a and 3b are irradiated to a mask alignment mark 1 in the XZ plane and at an equi-incident angle by means of an Acoustic Optical Modulator (AOM). Further, HeNe laser beams 4a and 4b are irradiated to a substrate mark 2 in the XZ plane and at the same equi-incident angle as described above. These HeNe laser beams 3 and 4 used are modulated in advance to 79.9 MHz and 80.0 MHz respectively. On the mask is formed a membrane window 7 for allowing the incidence of HeNe laser beam 4 to pass through to the substrate mark 2. The HeNe laser beams 3a and 3b projected to the mask alignment mark 1 are given a primary diffraction in the direction of +Y in YZ plane to obtain a detecting light 5. On the other hand, the HeNe laser beams 4a and 4b projected to the wafer alignment mark 2 are given a primary diffraction in the direction of +y in YZ plane to obtain a detecting light 6. Then, a phase difference between the detecting light 5 and the detecting light 6 is measured to perform the alignment between the mask and the wafer (substrate).

As explained above, in the alignment using this system, a disturbance light generated from the multiple reflection between the substrate and the mask is mingled into she detecting light from the alignment marks of the mask and substrate as shown in FIG. 2, thereby giving rise to the cause of deterioration of alignment accuracy. In order to eliminate this disturbance light, an alignment mark is devised, which will be explained with reference to the drawings.

Figure 4:
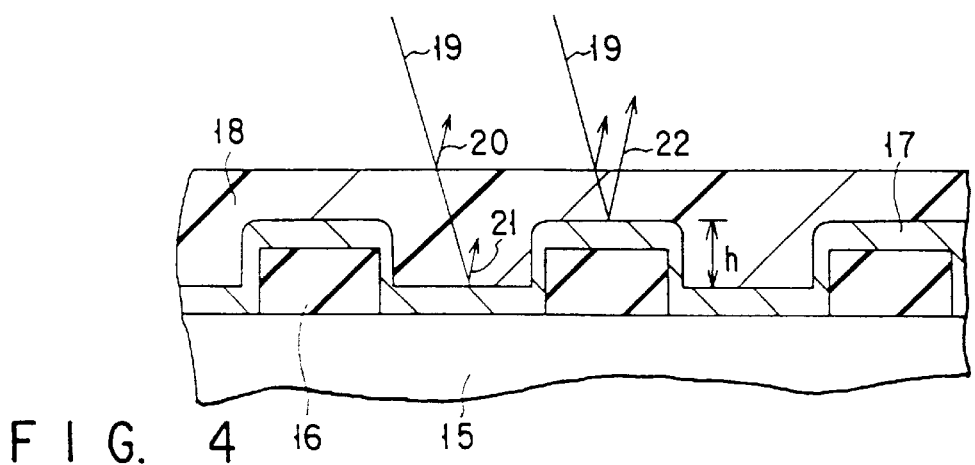
FIG. 4 is a sectional view of an alignment mark employed in Example I-1.

FIG. 4 exhibits the cross-sectional view of an alignment mark according to this example.

In the alignment mark shown in FIG. 4, an alignment mark 16 formed of silicon oxide is formed on a substrate 15, forming a step 0.95 $\mu$m in height. On the concave portion and convex portion constituting the step is formed a 0.4 $\mu$m thick metallic film 17 made for example of aluminum. On this metallic film 17 is deposited a resist layer 18 containing a dyestuff having a linear absorption coefficient (k) of 2.7 $\mu$m$^{-1}$ to the alignment light. This dyestuff-containing resist layer 18 contains 2.0% in concentration of anthraquinone-based organic dyestuff having an absorption wavelength in the vicinity of 633 nm, or the wavelength of HeNe laser to be used as an alignment light.

The alignment light 19 projected to the substrate having on its surface the resist layer as mentioned above is reflected by the surface of the resist, thereby divided into the partial-lights, i.e., a partial-light 20 reflected by the surface of the dyestuff-containing resist layer 18, and a couple of partial-light 21 and 22 whose intensities are first attenuated in the dyestuff-containing resist layer 18 and then reflected by the interface of the aluminum film 17 to be again attenuated in the dyestuff-containing resist layer 18. Since a light-path of the partial-light 21 is longer than that of the partial-light 22 by the proportion of twice the height (h) of the step (h×2), the partial-light 21 is absorbed in the resist film. As a result, a contrast of alignment mark is increased. Accordingly, the contrast of the alignment mark can be controlled by adjusting the linear absorption coefficient (k) of the dyestuff-containing resist 18 and the step (h).

Figure 5:
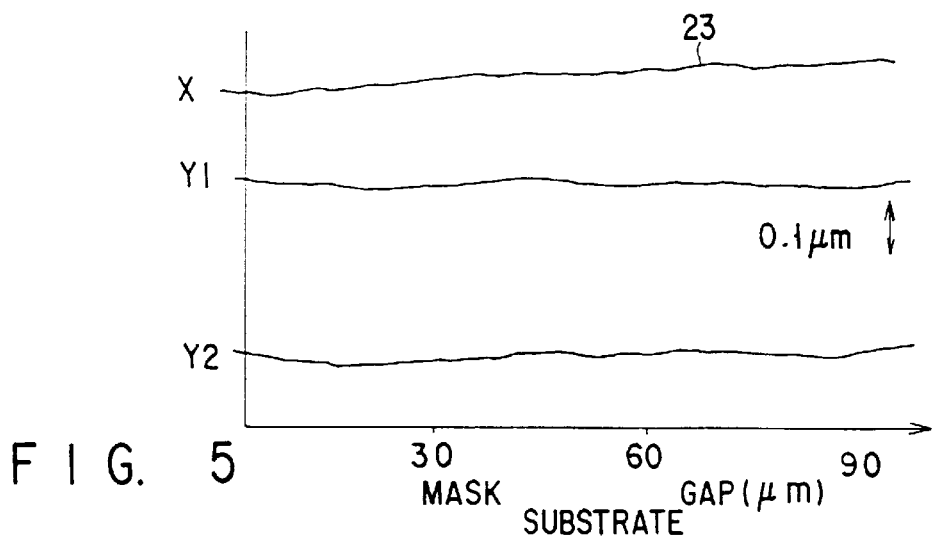
FIG. 5 is a graph showing signal intensity for explaining Example I-1.

An aluminum substrate provided with an alignment mark of increased contrast prepared as mentioned above was subjected to a measurement with respect to a detecting light intensity while changing the distance of space between the mask and the substrate, the results being shown in FIG. 5 shows. The exposure apparatus used in this measurement was designed to measure an exposure area of 15 nm squares in which three alignment systems (X, Y1 and Y2) were mounted. As shown in FIG. 5, the amplitude of a noise component 23 is very small, and an error in the alignment accuracy due to this noise component 23 can be controlled, when converted into positional distance, to ±0.01 $\mu$m or less. Namely, it can be seen that, by uniformly forming a metallic film on the alignment mark of a low reflectance substrate, and by further forming a dyestuff-containing resist layer on the metallic film, it is possible to achieve substantially an accurate alignment of the substrate mark.

The above results were obtained by measuring the alignment mark of a chip located at the center of substrate. However, it has been confirmed that almost the same result indicating a decrease in amplitude of a noise component can be obtained for a chip located at the periphery of the substrate, thus indicating a decrease in non-uniformity of the measured values obtained from all alignment marks of the wafer.

The reasons for these results may be explained as follows.

First, the diffraction efficiency of the alignment light to the secondary diffraction order (X, Y) as the alignment light is projected from the +X direction in XZ plane onto the alignment mark 2 on the substrate is defined as $g_{x,y}$. This order of diffraction light was defined such that the order of diffraction light diffracting at a larger outgoing angle than that of normal reflection was defined as plus, and the order of diffraction light diffracting in the right side to incident plane was defined also as plus. For example, when an alignment light 4b is diffracted go a diffraction order of (-1, 1) at an alignment mark, the diffraction efficiency thereof was represented by $g_{-1,1}$. On the other hand, in order to allow the other alignment light 4a to be diffracted in the same direction as the detecting light 6, the diffraction order in this case can be expressed as (-1,-1). In this case, the diffraction efficiency can be expressed as $g_{-1,-1}$.

Assuming that the reflectivity $r_m$ and the transmitivity $t_m$ of X-rays at the membrane window of the mask are independent of an incident angle, the alignment lights 4a and 4b projected from two directions are reflected multiply and diffracted respectively between the membrane window 7 and the substrate mark 2, then reflected lights and diffracted lights are directed various directions. The electric vectors $E_+$ and $E_-$ of the light thus reaching the detector among the reflected lights and diffracted lights can be represented by the following equation (1). In this equation (1), the coefficient dependent on time can be ignored.

$$\frac{E_\pm}{E_{i\pm}t_m^2} = \frac{g_{-l,\pm l}}{\{l-g_{0,0}r_m\exp(-i\delta)\}^2} +$$

$$\frac{r_m\exp(-i\delta)}{\{l-g_{0,0}r_m\exp(-i\delta)\}^3} \times \sum_{\substack{i+k=-l, j+l=\pm l \\ i=j\neq 0 \text{ or } j=k\neq 0}} g_{i,j}g_{k,l} +$$

$$\frac{r_m^2\exp(-2i\delta)}{\{l-g_{0,0}r_m\exp(-i\delta)\}^4} \times \sum_{\substack{i+k+s=-l, j+l+t=\pm l \\ i=j\neq 0 \text{ or } k=l\neq 0 \text{ or } s=t\neq 0}} g_{i,j}g_{k,l}g_{s,t} +$$

$$\ldots = g_{-l,\pm l} + 2r_m\exp(-i\delta) \times \sum_{\substack{i+k=-l, j+l=\pm l \\ (i,j)\neq(k,l)}} g_{i,j}g_{k,l} + \ldots$$

Equation (1)

wherein $E_{i+}$ and $E_{i-}$ are respectively an electric vector, $\delta=4\pi d/\lambda$, d is a distance (GAP) between the mask and the substrate, and $\lambda$ is a wavelength of the alignment light.

If the amplitude of the first term and the amplitude of the second term in the equation (1) are respectively represented by $E_{d\pm}$ and $E_{o\pm}$ and defined by the following equations (2) and (3), the electric vectors $E_+$ and $E_-$ can be represented by the equation (4).

$$E_{d\pm} = E_{i\pm}g_{-1,\pm 1}t_m^2 \qquad \text{Equation (2)}$$

$$E_{o\pm} = 2E_{i\pm}t_m^2 r_m \times \sum_{\substack{i+k=1, j+l=\pm 1 \\ (i,j)\neq(k,1)}} g_{i,j}g_{k,1} \qquad \text{Equation (3)}$$

$$E_\pm = E_{d\pm} + E_{o\pm}\exp(-i\delta) + \ldots \qquad \text{Equation (4)}$$

Σ in the equation (3) represents the sum total of all of different $g_{i,j} \times g_{k,l}$ which meets the conditions of (i+j=-1; i+l=1) or (i+k=-1; j+k=-1). The first term in the equation (4) corresponds to the detecting light 6, and other terms excluding the first term are the sum total of disturbance light 12. If $E_d$ and $E_o$ are defined by the following equations (5) and (6), the intensity of light "I" reaching the detector can be represented by the following equation (7).

$$E_d=E_{d+}+E_{d-} \qquad \text{Equation (5)}$$

$$E_o=E_{o+}+E_{o-} \qquad \text{Equation (6)}$$

$$I=|E_++E_-|^2=|E_d|^2+|E_o|^2+|E_dE_o|\cos(\delta+\Delta)+ \qquad \text{Equation (7)}$$

Figure 3:
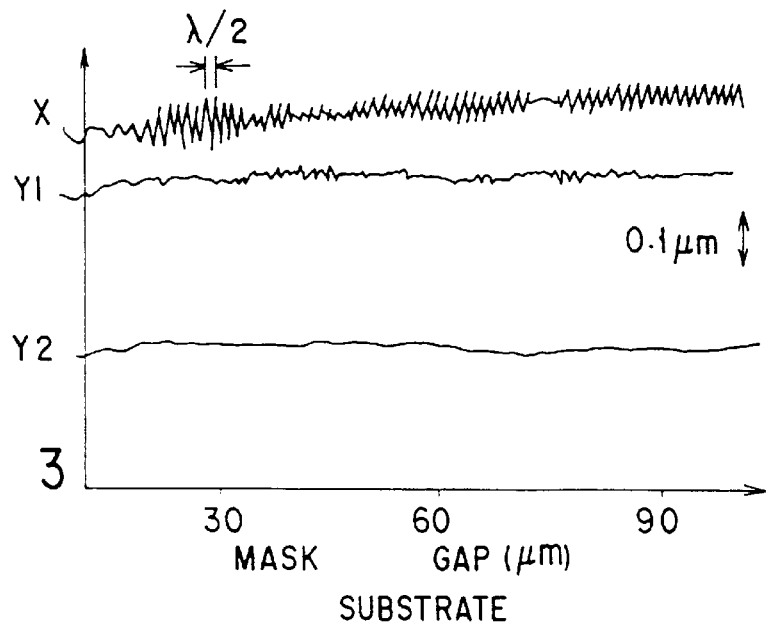
FIG. 3 is a graph showing detecting signals according to the prior art.

In this case, the intensity of light "I" reaching the detector can be represented by the direct current components indicated by the first and second term in the equation (7), and the alternating current component indicated by the third term (a cyclical noise) in the equation (7) in electrical explain. It is considered that the disturbance light 12 mentioned above may be the cause of generating the alternating current of the third term, resulting in the generation of a cyclical noise as shown in FIG. 3.

If it is assumed that (1) intensities of the alignment light 4a and 4b projected from two directions are almost the same; and that (2) there is existed no asymmetry of diffracted light originating from the sectional shape of alignment mark or from an inclined optical axis, i.e. $g_{x,y}=g_{x,-y}$ in order to minimize this cyclical noise component shown in the equation (7), the value represented by the equation (8) should desirably be minimized.

$$\left|\frac{E_o}{E_d}\right| = \left|\frac{E_{o+} + E_{o-}}{E_{d+} + E_{d-}}\right| \propto \left|r_m \sum_{\substack{i+k=1, j+1=1 \\ (i,j) \neq (k,l)}} g_{i,j} g_{k,l} / g_{-l,l}\right| \to \min \quad \text{Equation (8)}$$

Namely, in order to minimize the value represented by the equation (8), it is required to sufficiently lower the reflectivity $r_m$ of the membrane window 7 and to increase the diffraction efficiency $g_{-l,l}$ in the direction of the detector. In particular, if the value of $g_{-l,l}$ is near to zero, the value of the equation (8) is diverged thereby increasing noise rapidly. For this reason, it is important that the value of $g_{-l,l}$ is stable kept remained within a range remote from zero, and should desirably be as large as possible.

According to this example, since a dyestuff-containing resist is coated on an aluminum film formed on the substrate mark, it is possible to enlarge the difference between the intensity of partial-light 22 reflected by the convex portion and passed through the resist film and the intensity of partial-light 21 reflected by the concave portion out of the light diffracted from the substrate mark. Namely, by coating a dyestuff-containing resist on the alignment mark, the increase in contrast of the substrate mark has been realized. Further, since the variation of diffraction efficiency $g_{-l,l}$ due to the difference in sectional shape of the mark can be more minimized as the value of contrast becomes closer to 1, with the value of $g_{-l,l}$ being stabilized at a constant value which is remote from zero, it is possible to decrease the alternating current component in the equation (7) and to obtain a measurement wavelength free from noise.

Since the diffraction efficiency depends mainly on the characteristic as a diffraction element of the alignment mark, it is difficult to sufficiently improve the diffraction efficiency even if an aligner is improved. Accordingly, this example which is very effective in improving the diffraction efficiency is greatly useful in minimizing the noise in the alignment signals.

Figure 6:
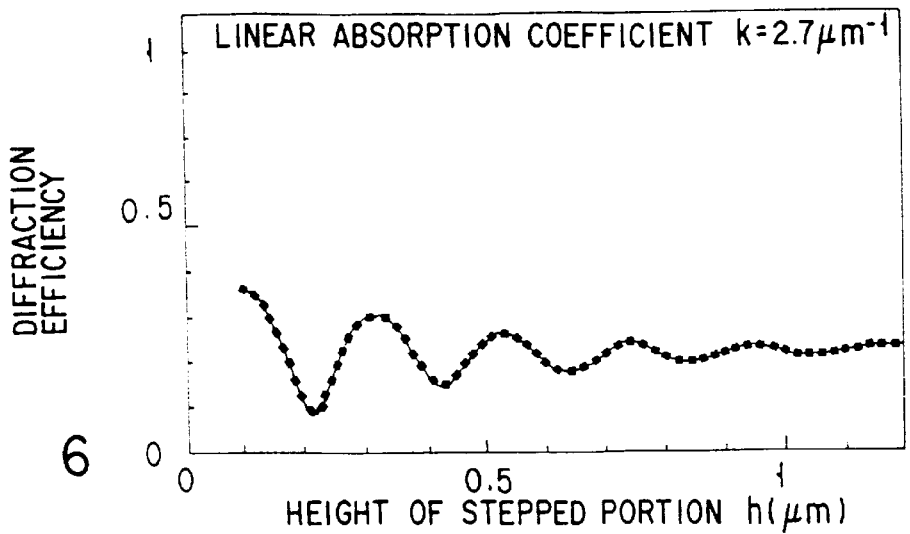
FIG. 6 is a graph showing a result of analysis of the diffraction efficiency of Example I-1.

An aluminum substrate provided with an alignment mark of increased contrast prepared as mentioned above was subjected to a measurement with respect to the diffraction efficiency $g_{-l,l}$ in the direction of detector in relative to the height of the step of the alignment mark, the results being shown in FIG. 6. If the linear absorption coefficient with respect to the alignment light onto the resist film 18 is assumed to be 2.7 $\mu m^{-1}$, the reflectance from the concave portion of the alignment mark is sufficiently minimized as compared with the reflectance from the convex portion as the height of the step becomes larger as shown in FIG. 6. As a result, the contrast is increased and the diffraction efficiency $g_{-l,l}$ is stabilized.

Figure 7:
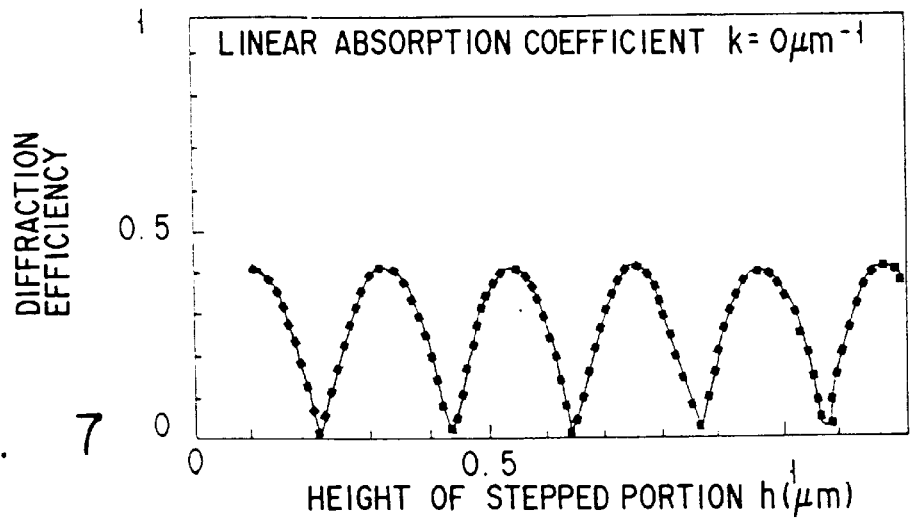
FIG. 7 is a graph showing a result of analysis of the diffraction efficiency of Comparative Example.

FIG. 7 illustrates a calculated result on the relationship between the height of step and the diffraction efficiency when the linear absorption coefficient of the resist coated on an aluminum substrate is assumed to be 0 $\mu m^{-1}$, i.e., when the contrast is assumed to be zero as a comparative example. As shown in FIG. 7, the diffraction efficiency changes very much in accordance with the change in height of the step. For example, for every change in height by a distance of $(0.15/n)$ $\mu m$ of the step, the diffraction efficiency $g_{-l,l}$ changes from 0 to the maximum, and then from the maximum to 0. "n" in this case means a refractive index of the resist film 18 coated on the surface of the substrate. As indicated above, the diffraction efficiency becomes nearly zero at a certain height of the step, and because of this, the accuracy of alignment signal at this height of the step is considered to have been deteriorated to a great extent.

As shown in FIG. 7, when the contrast is zero, the diffraction efficiency changes from 0 to the maximum as the height of the step changes at a distance of only about 0.1 $\mu m$, so that the diffraction efficiency in some of the substrate marks would be deteriorated unless the height of the step is controlled within the range of about $\pm 0.05$ $\mu m$. However, it is actually impossible to control the height of all marks on the surface of a wafer within the range of about $\pm 0.05$ $\mu m$. Therefore, it is impossible to avoid the presence of a mark which is small in diffraction efficiency due to a slight difference in height of the mark.

It should be noted that, as shown in FIG. 6, the minimum value of diffraction efficiency according to this example does not become zero in contrast to the case where the linear absorption coefficient of the resist is assumed to be 0 $\mu m^{-1}$ (FIG. 7). In particular, when the height (h) of the step is larger than 0.6 $\mu m$, the variation of diffraction efficiency becomes small and therefore the value of the diffraction efficiency is stabilized. It can be seen from these results that the non-uniformity of the diffraction efficiency of detecting light due to the error in height of the step of the mark can be improved.

In the followings, the effects of this example will be explained with reference to a case where the cross-sectional shape of the substrate mark indicating the identical position (for example, X) of a plurality of different chips is not uniform. To be more specific, an example of lowering the non-uniformity in offset value by coating the above-mentioned dyestuff-containing resist on the surface of the substrate having the marks formed non-uniform shape one another will be explained.

The complex amplitude of light beam reached to a detector after an alignment light projected from the plus direction in the XZ plane is diffracted at the alignment mark of a substrate is defined as $W_{+1}$. On the other hand, the complex amplitude of light beam diffracted after an alignment light is projected from the minus direction in the same plane is defined as $W_{-1}$. Then, these $W_{+1}$ and $W_{-1}$ can be represented by the following equations (9) and (10).

$W_{+1}=B_{+1}\exp\{2\pi i(\gamma_1 t + \delta w/P)\}$ \quad Equation (9)

$W_{-1}=B_{-1}\exp\{2\pi i(\gamma_2 t + \delta w/P)\}$ \quad Equation (10)

wherein P is a pitch of mask grating; $\delta_w$ is the position of mark; $\delta_1$ and $\delta_2$ are modulation frequency of couple of alignment light modulated using an acousticoptical modulator (AOM). $B_{+1}$ and $B_{-1}$ represent respectively a complex amplitude of light beam diffracted after an alignment light is projected from the plus or minus direction, and can be represented by the following equations (11) and (12).

$B_{+1}=b_{+1}\exp(i\beta_{+1})$ \quad Equation (11)

$B_{-1}=b_{-1}\exp(i\beta_{-1})$ \quad Equation (12)

wherein $b_{+1}$ and $b_{-1}$ represent respectively an amplitude of diffracted light beam of an alignment light; and $\beta_{+1}$ and $\beta_{-1}$ represent respectively a phase of diffracted light.

Therefore, the light intensity $I_w$ diffracting in the direction of the detector can be represented by the following equation (13).

$$I_W = |W_{-1} + W_{+1}|^2 \qquad \text{Equation (13)}$$

$$= b_{-1}^2 + b_{+1}^2 + b_{-1}b_{+1}\cos\{2\pi(\gamma_1 - \gamma_2) +$$

$$4\pi\delta_w/P + (\beta_{+1} - \beta_{-1})\}$$

In the same manner, the light intensity $I_m$ diffracting in the direction of the detector from the minus side can be represented by the following equation (14).

$$I_m = |M_{-1} + M_{+1}|^2 \qquad \text{Equation (14)}$$

$$= a_{-1}^2 + a_{+1}^2 + a_{-1}a_{+1}\cos\{2\pi(\gamma_1 - \gamma_2) +$$

$$4\pi\delta_m/P + (\alpha_{+1} - \alpha_{-1})\}$$

In the actual measurement, the direction of diffracted light can be changed by changing the pitch of the substrate mark and wafer mark in the direction of Y, so that $I_w$ and $I_m$ can be measured using an individual detector. The relative position between the substrate mark and the mask mark can be measured from the difference in phase of this intensity amplitude, i.e., $[4\pi(\delta_w-\delta_m)/P]+(\beta_{+1}-\beta_{-1})-(\alpha_{+1}-\alpha_{-1})$. The value of $(\beta_{+1}-\beta_{-1})-(\alpha_{+1}-\alpha_{-1})$ corresponds to the offset value in the measurement. The reason causing the offset value, i.e. the reason that $\beta_{+1}$ is not equal $\beta_{-1}$ and that $\alpha_{+1}$ is not equal $\alpha_{-1}$ is as follows. It is that the alignment marks do not have an idealized symmetric sectional shape.

$(\alpha_{+1}-\alpha_{-1})$ is a term dependent on the cross-sectional shape of the mask mark. When a same mask is used, the term is constant. However, if the cross-sectional shape of the substrate mark differs from each other, the alignment accuracy would be deteriorated due to the reason explained as follows. Namely, when a couple of laser beams 4a and 4b are projected, a phase difference $(\beta_{+1}-\beta_{-1})$ is caused to generate between the diffracted light from the incident light 4a and the diffracted light from the incident light 4b. The diffracted light from each incident light may be said to be a contributing portion of the incident light at the detector 6. When the substrate mark differs in its cross-section from each other, the phase difference also differs from one another depending on each substrate mark, so that there would be non-uniformity in the relative position thus measured thereby giving rise to the deterioration of alignment accuracy.

As one example of such a case, an alignment mark formed in a checkerwise lattice pattern and having a rectangular cross-section was selected, and the phase difference $\Delta\beta$ ($=\beta_{+1}-\beta_{-1}$) of diffracted light when the bottom of concave portion is inclined was calculated.

First, a resist of the conventional type was coated on a substrate mark whose concave portion has an inclined bottom. Then, the relationship between the height (h) of step and the phase difference $\Delta\beta$ of diffracted light was studied, the result being shown in FIG. 8. The conventional resist used herein indicated no absorption to the alignment light. The angle of inclined bottom of the concave portion was (0.1/2.25) in the direction of X.

Figure 8:
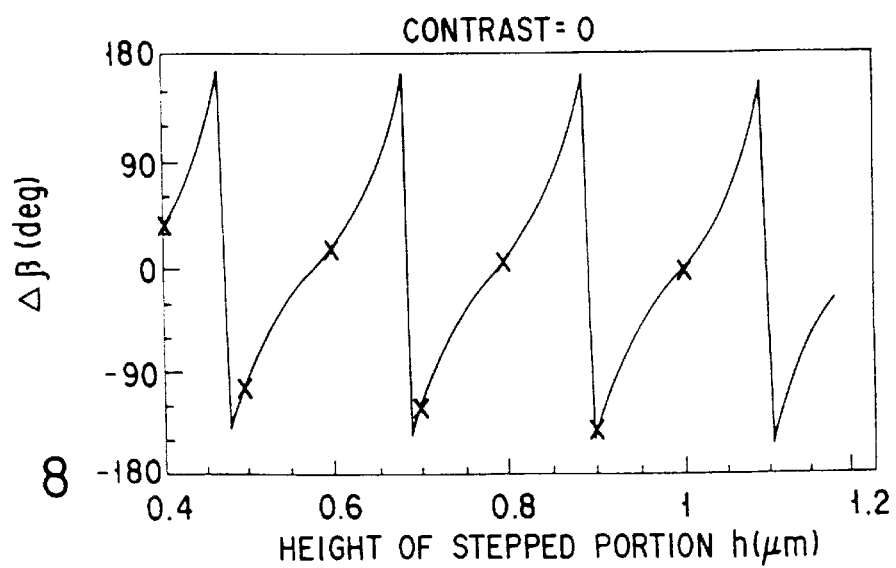
FIG. 8 is a graph showing a result of analysis of the phase difference of Comparative Example.

As shown in FIG. 8, when there was an inclination in the bottom of the concave portion, the phase difference $\Delta\beta$ was changed in accordance with the change in height of the step. Accordingly, if the height of the step of the mark in the substrate was not uniform, the phase difference $\Delta\beta$ at each substrate mark did not become zero, but indicated a different value depending on the height. Due to such changes in $\Delta\beta$, the alignment accuracy was found deteriorated.

Figure 9:
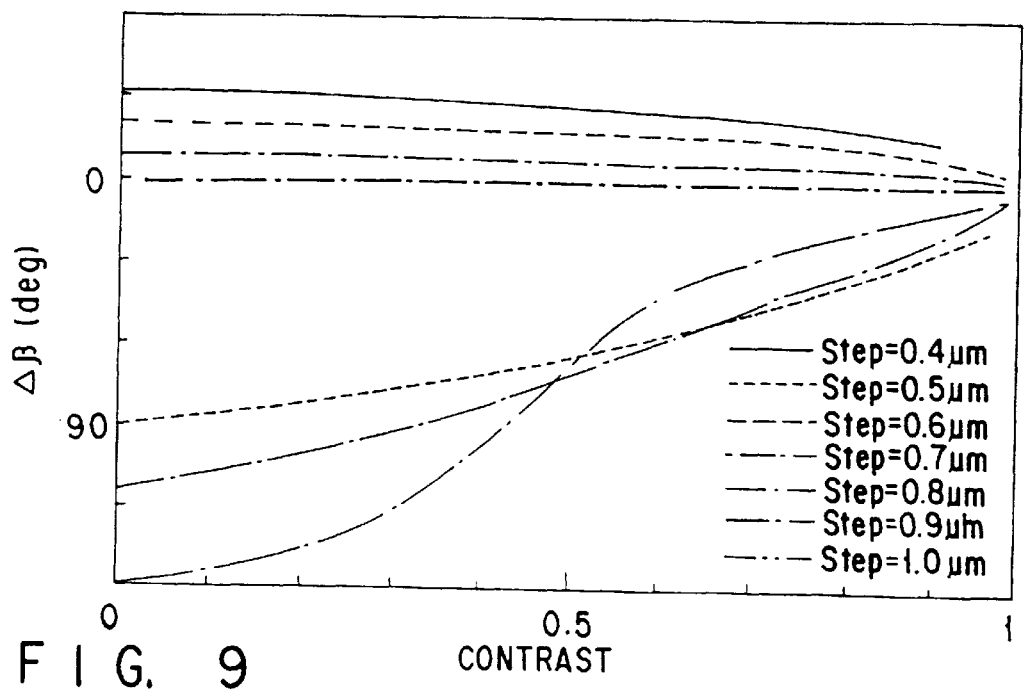
FIG. 9 is a graph showing a result of analysis of the phase difference of Example I-1.

Additionally, the contrast of the substrate mark was caused to increase, and the relationship between the change in contrast and the phase difference $\Delta\beta$ of diffracted light was studied, the result being shown in FIG. 9. In this case, the increase in contrast of the substrate mark was effected by increasing the linear absorption coefficient of the resist to be coated on the mark.

The measurement was performed on seven different kinds of step differing in height from each other by a distance of 0.1 μm, the lowest height being 0.4 μm and the highest height being 1.0 μm.

As shown in FIG. 9, when the contrast becomes closer to 1, the phase difference $\Delta\beta$ also indicated a value closer to 0 in any example differing in height of step.

From the results shown in FIGS. 8 and 9, the followings can be said about the non-uniformity of the phase difference $\Delta\beta$. Namely, in the case where a resist incapable of absorbing the alignment light is coated on the substrate mark (FIG. 8), the minimum value of $\Delta\beta$ was −180 deg, and the maximum value of $\Delta\beta$ was +180 deg among the samples of step ranging from 0.4 to 1.0 μm in height, thus indicating a large non-uniformity. On the other hand, since a resist capable of absorbing the alignment light is coated on the aluminum substrate, the contrast of the alignment mark is increased. The phase difference $\Delta\beta$ shown in FIG. 8 at each height (marked "X" in FIG. 8) is converged to zero as shown in FIG. 9. For example, when the height of step is 0.8 μm, the phase difference $\Delta\beta$ indicates −80 deg at contrast 0.5. The value of $\Delta\beta$ at contrast 0.5 is less than half of that at contrast 0. Accordingly, a divergence of phase difference $\Delta\beta$ is decreased to about half of that at contrast 0 for all height of step. In particular, when the contrast of the substrate mark was adjusted to 0.95, the phase difference $\Delta\beta$ could be decreased to about 1/10.

As explained above, it is possible to decrease the non-uniformity in phase difference of the detecting light originating due to the difference in cross-sectional shape of the substrate mark by coating a dyestuff-containing resist on the aluminum film formed on the mark. In other words, it is possible to make constant the offset value throughout whole substrate marks, thereby improving the alignment accuracy.

Next, X-ray proximity lithography was performed on a substrate having an alignment mark of this example formed thereon by using an alignment system shown in FIG. 1. The substrate used herein was provided on its surface with an alignment mark having a step about 0.95 μm in height, and with about 0.4 μm thick alloy layer consisting of aluminum and copper deposited on the alignment mark. Additionally, a radiation-sensitive negative type resist containing 1.0% by weight of anthraquinone-based organic dyestuff was coated on this metallic film.

For the purpose of comparison, a resist of the conventional type not containing a dyestuff was coated on the substrate having the same structure of metallic film deposited thereon, and was subjected to X-ray proximity lithography by using the same alignment system as mentioned above.

As a result, it was found that in the case of the substrate provided with the alignment mark of this example which was coated with a dyestuff-containing resist, the alignment accuracy was 25 nm (3σ). This degree of accuracy is almost identical with the case where this alignment system is applied to a substrate having relatively low reflectance in for example LOCOS process or a gate process. The sensitivity of the resist added with the dyestuff was deteriorated by about 5% as compared with the conventional resist, but the deterioration of resolution was not recognized at all. Specifically, it was confirmed that a resolution of such high level as a fine pattern of 0.15 μm in line width could be formed.

By contrast, in the alignment exposure using the conventional resist not containing a dyestuff, the alignment accuracy was 260 nm (3σ). It will be clear from these results that the non-uniformity of alignment (3σ) can be minimized by this example to about 1/10, and at the same time, alignment the accuracy can be improved by about 10 times.

In the following example, the manufacture of device through the application of this example to the X-ray proximity lithography for forming a metallic wiring will be explained in comparison with the conventional techniques.

When a metallic wiring is to be formed by using the conventional techniques, line density is at the same level as forming a wiring having 0.4 μm line width. Therefore, it would be meaningless to provide the resist with a high resolution. Additionally, it is impossible in the conventional techniques to prepare a wiring of high reliability in single step, and therefore the manufacture of a wiring has to be performed through a plurality of manufacturing steps.

On the other hand, when this example is applied to the manufacture of wiring, it is possible to form a fine pattern of 0.15 μm in line width, and non-uniformity in alignment can be inhibited to very small value. Moreover, it is possible to prepare a wiring of high reliability in single step. As a result, it is possible to miniaturize the cell of device by at least 10% as compared with the conventional cell, and at the same time, to reduce the number of the manufacturing steps in the manufacture of wiring.

In the example mentioned above, HeNe laser beam was used as an alignment light, and a resist containing an anthraquinone-based organic dyestuff having an absorption wavelength at the vicinity of 633 nm which is the wavelength of HeNe laser was coated on a metallic film. However, this invention is not limited to these alignment light and resist. Any kind of resist or dyestuff-containing resist can be used depending on the kind of alignment light to be irradiated, as far as the resist has an absorption wavelength which is nearly identical with the wavelength of the alignment light to be employed. Conversely, an alignment light may be subsequently selected depending on the kind of resist to be used.

For example, if a resist for i-line which was colored in red is to be used, HeCd laser beam to be absorbed by red can be used whereby achieving the effects of this invention.

Specifically, the combinations of alignment light source and resist as shown in Table 1 can be employed.

TABLE 1

| Alignment light source | Resist | Dyestuff to be added (Conc.) |
|---|---|---|
| HeNe laser (λ = 633 nm) | Radiation-sensitive resist | Anthraquinone-based dyestuff (1.0 wt %) |
| HeCd laser (λ = 442 nm) | Resist for i-line | — |
| Ar laser (λ = 514.5 nm) | Radiation-sensitive resist | Disazo-based dyestuff (1.0 wt %) |

Furthermore, the following compounds represented by the formulas (III) and (IV) were used as an example of anthraquinone-based dyestuff and disazo-based dyestuff respectively for forming a pattern in the same manner as mentioned above, and the results were studied. These dyestuffs were incorporated into the resist at the amount of 1.0% by weight, and the resultant resists were coated over the mark thereby forming the alignment mark of this example. Then, on this alignment mark, the exposure was performed using X-rays.

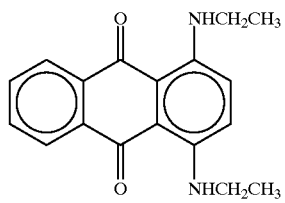

Formula (III)

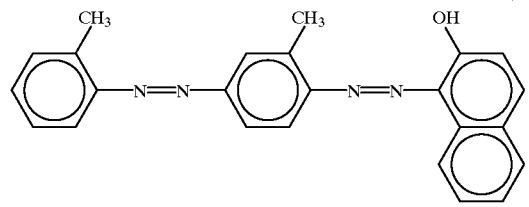

Formula (IV)

As a result, in the example where anthraquinone-based dyestuff is added to a resist, it was possible to form a fine pattern as fine as 0.15 μm in line width, though the lowering in sensitivity of 5% or less was recognized. Whereas, in the example where disazo-based dyestuff is added to a resist, it was possible to form a fine pattern as fine as 0.15 μm in line width, though the lowering in sensitivity of 10% or less was recognized.

Table 2 shows the wavelength of each alignment light, the reflectance of aluminum to these wavelength, and the linear absorption coefficient of the resists.

TABLE 2

| Alignment light source | Reflectance of Al substrate | Linear absorption coefficient |
|---|---|---|
| HeNe laser (λ = 633 nm) | 91% | 0.7 $\mu m^{-1}$ |
| HeCd laser (λ = 442 nm) | 92% | 0.8 $\mu m^{-1}$ |
| Ar laser (λ = 514.5 nm) | 92% | 1.2 $\mu m^{-1}$ |

As shown in Table 2, since each resist exhibits a large absorbency to the alignment light, it is possible to increase the reflectance ratio between the convex portion and concave portion by coating the resists over the step of the mark having an aluminum layer deposited thereon. For example, in the case of alignment mark having a step 0.5 μm in height, the reflectance ratio was 2 or more for every samples. Although there may be a slight difference depending on the kind of alignment system, the alignment accuracy is considered to be increased by 50% or more.

The method of forming a light absorption layer on the alignment mark of this invention will be explained with reference to (Example I-2) to (Example I-6) as follows.

Example I-2

An alignment mark deposited with a light absorption layer consisting of a dyestuff-containing resist will be explained with reference to FIGS. 10A and 10B.

A light absorption material 27 can be buried in the concave portion of the substrate mark in accordance with the following steps.

Figure 10A:
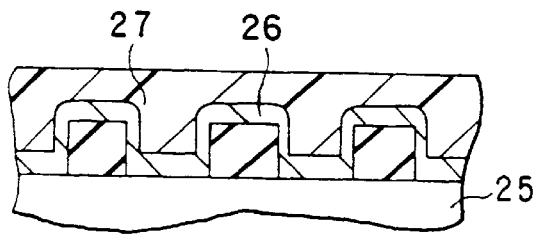
FIGS. 10A and 10B shows respectively a sectional view illustrating the manufacturing method of alignment mark of Example I-2.

First, as shown in FIG. 10A, an alignment light absorption material 27 is coated, through spin coating, on the surface of a substrate 25 provided with a substrate mark 26 consisting of silicon oxide and with an aluminum film deposited on the substrate mark 26. This light absorption material 27 is formed of a material which can be removed by etching method. This light absorption material may be coated in any desired thickness as long as the convex portion of the substrate mark can be covered with it. However, taking the subsequent step for removing the light absorption material into consideration, the thickness of the light absorption material layer should desirably be 0.5 $\mu$m or less.

Figure 10B:
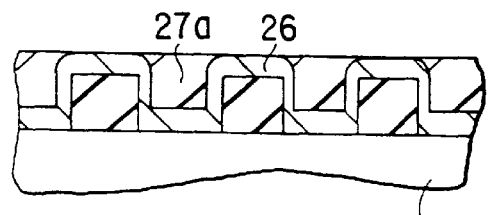

Then, the light absorption material is removed by means of an etching treatment using oxygen plasma etching or a grinding treatment until the surface of the convex portion of the alignment mark is exposed as shown in FIG. 10B. By the way, there is no need to completely remove the light-absorbing material from the upper surface of the convex portion of mark in this etching treatment or grinding treatment, but part of the light-absorbing material may be left thereon, provided it is capable of detecting a signal intensity from the convex portion.

In the case where the substrate mark is consisted of a low step having a height of 0.3 $\mu$m or less, since 5 the contrast of the mark can be improved by burying the light-absorbing material 27 only in the concave portion of the substrate mark 26, the detection of the alignment signal can be easily performed. Moreover, it is possible to achieve the detection of signal and to improve the alignment accuracy according to this example even in such a case where the height of the step of the alignment mark is so low that the prior art has been so far failed to detect an alignment signal therefrom.

Example I-3

In this example, a material whose absorption coefficient to an alignment light of irradiation region can be reduced by the irradiation of specific UV-rays is employed as a light absorption material. This material may be suitably selected according to the wavelength of the ultraviolet.

Figure 11A:
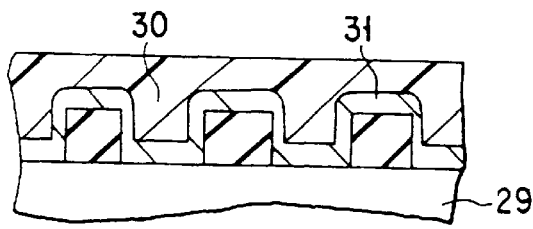
FIGS. 11A and 11B shows respectively a sectional view illustrating the manufacturing method of alignment mark of Example I-3.

Referring to FIG. 11A, an alignment light absorption material 30 is coated, through spin coating, on the surface of a substrate 31. The penetrating depth of the specific UV rays to this alignment light absorption material 30 is about 0.5 $\mu$m. The alignment light absorption material 30 is coated in such a manner that the thickness over the convex portion of the mark is about 0.5 $\mu$m and the resultant coated surface thereof is flat.

Figure 11B:
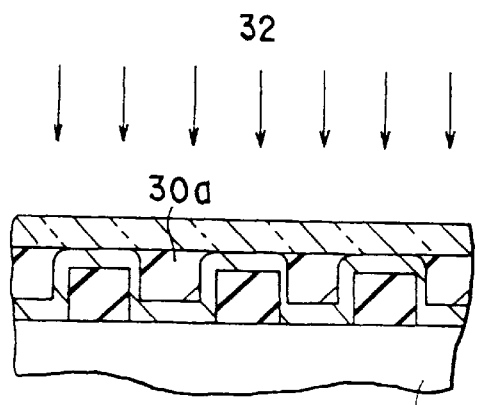

This alignment light absorption material layer formed on the substrate mark is then subjected to a clarifying treatment by irradiating a specific ultraviolet rays 32 thereon so as to clarifying the upper portion of the layer as shown in FIG. 11B, i.e., a thickness of which being almost the same as that lying over the convex portion. With this treatment, it is possible to improve the alignment signal intensity while increasing the contrast of the substrate mark.

With this example, it is possible to obtain the same effects as in the previous example. Further, this example is advantageous in that the alignment signal intensity can be controlled by changing the intensity or irradiating time of the ultraviolet rays to be irradiated.

Example I-4

In this example, a material which can be softened at a specific temperature is employed as a light absorption material. For example, carbon resin can be used as such a light absorption material.

An alignment mark deposited with a softening light absorption material and manufacturing method thereof will be explained with reference to FIGS. 12A and 12B.

Figure 12A:
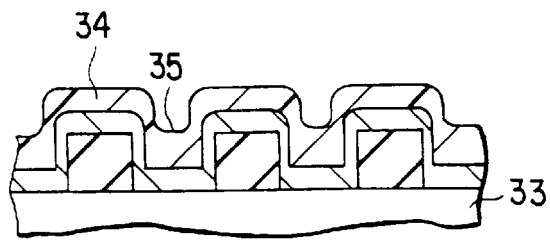
FIGS. 12A and 12B shows respectively a sectional view illustrating the manufacturing method of alignment mark of Example I-4.
Figure 12B:
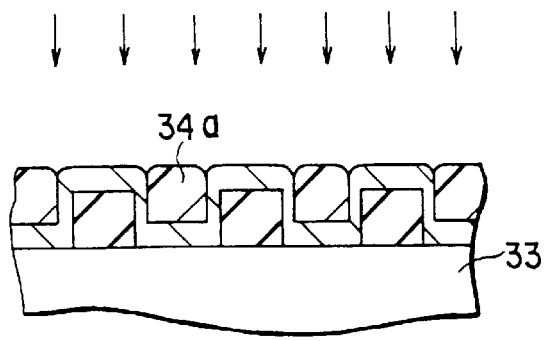

Referring to FIG. 12A, an alignment light absorption material 34 is deposited all over the substrate mark comprising a concave portion and a convex portion thereby forming a layer having half a thickness of concave or convex portion. Then, the light absorption material is subjected to heat treatment at a temperature higher than the softening temperature of the light absorption material, thereby softening and allowing the light absorption material to flow into the concave portion 35. As a result, the concave portion 35 is buried with the light absorption material as shown in FIG. 12B.

When the contrast of the substrate mark is increased in this manner, the S/N ratio is also increased thereby obtaining almost the same effects as in the previous examples.

Example I-5

It is also possible to deposit a to-be-etched film consisting of a specific material as an etching-adjusting material on the light absorption material after the deposition of the light absorption material on the concave portion and the convex portion of the substrate mark and before the removal of this light absorption material. Any material may be employed as this etching-adjusting material as long as the material has almost the same etching rate as that of light absorption material.

The method of manufacturing this structure will be explained with reference to FIGS. 13A to 13C.

Figure 13A:
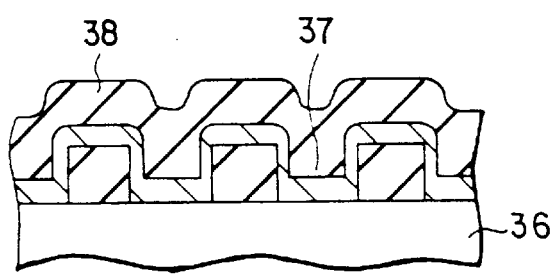
FIGS. 13A, 13B and 13C shows respectively a sectional view illustrating the manufacturing method of alignment mark of Example I-5.
Figure 13B:
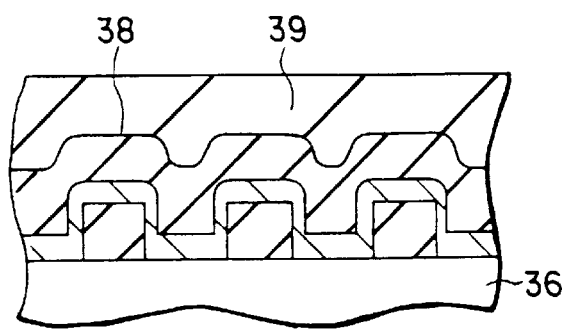

First, an alignment light absorption material such as a carbon film 38 is deposited on the concave and convex portions of the alignment mark region by means of sputtering as shown in FIG. 13A. Then, an etching-adjusting material such as silicon oxide film 39 is deposited on the alignment light absorption material layer as shown in FIG. 13B thereby forming a layer of flat surface having a sufficient film thickness.

Figure 13C:
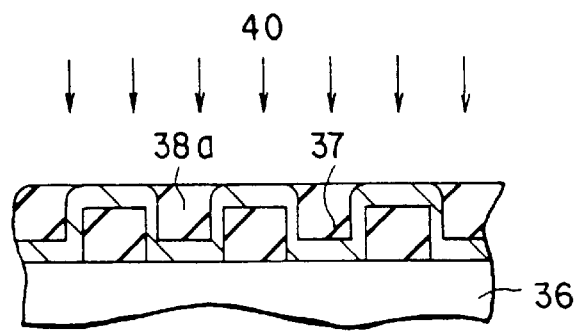

Subsequently, the surface of substrate mark is subjected to an etching treatment such as RIE (Reactive Ion Etching) thereby removing the alignment light absorption material together with the etching-adjusting material until a sufficient signal intensity can be obtained, thereby obtaining a structure as shown in FIG. 13C. In this etching treatment, there is no need to control the etching treatment in a manner that the surface of the light absorption material layer deposited on the concave portion of the mark becomes in flush with the surface of the convex portion of the mark. For example, part of the light absorption material layer may be left on the surface of the convex portion of the mark, or the surface of the light absorption material layer becomes lower than the surface of the convex portion of the mark. It is also possible to employ a grinding treatment in place of the etching, thereby removing the etching-adjusting material and the light absorption material.

In this example, a flat layer of alignment light absorption material 38 is formed on the concave portion 37 of the substrate mark thereby obtaining a sufficiently high S/N ratio. According to this method, it is possible to fill a light absorption material which is usually very difficult to flatly deposit so that the choice of useful light absorption material would be enlarged. According to this example, it is possible to expect the same effects as in the previous examples.

Moreover, it is possible to use a material which is inherently incapable of absorbing an alignment light for forming a light absorption layer. Namely, a material incapable of absorbing an alignment light is flatly coated on an alignment mark thereby forming a film on which an opacifying treatment is performed. Specifically, an organic material such as an ordinary resist material is coated on a high-reflective substrate, and then subjected to a hard baking treatment thereby opacifying the organic material coated on the substrate.

In the above examples, X-rays proximity lithography is explained as an exposure means. However, this invention is not limited to this, but every kinds of light exposure technique utilizing an optical system such as an electron beam or an ion beam can be applicable.

In Example I-1, the effect of this invention is explained with reference to a system wherein the detection of position is performed through the phase signal of alignment light. However, this invention is not limited to this system, but other kind of system wherein the detection of position is performed through light intensity signals can be utilized for improving the S/N ratio of an alignment signal.

One example of such a system will be explained with reference to FIGS. 14A and 14B.

In a system wherein the detection of position is performed through light intensity signals, an alignment light is first projected onto an alignment mark, and the resultant regular reflection light intensity from the alignment mark is measured by means of a line sensor or an area sensor. Then, a reflection intensity profile about the alignment mark as a whole is obtained from the measured signals, and a wave shape corresponding to the step is detected thereby calculating the position of the step.

Specifically, a resist capable of absorbing an alignment light as explained in Example I-1 is coated on a substrate deposited with a metallic film thereby forming an alignment mark, on which the alignment light is irradiated to measure a reflection intensity.

Figure 14A:
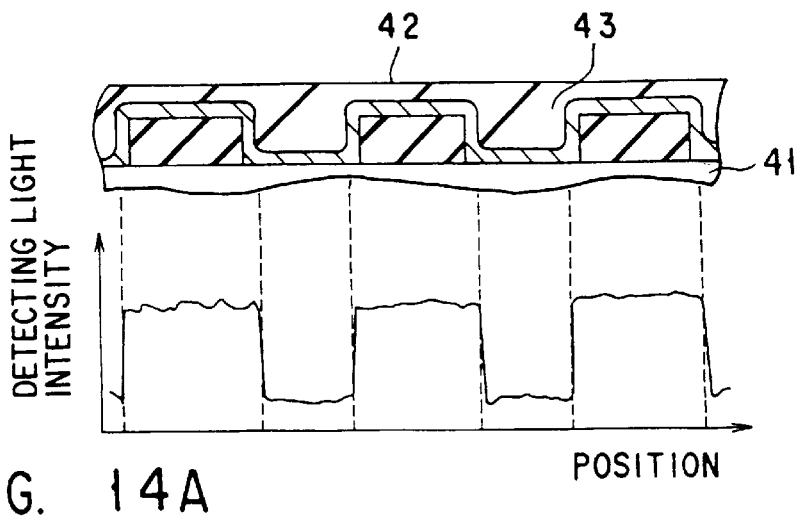
FIGS. 14A and 14B shows respectively a graph showing signals detected in Example I-1 and in the prior art.

The reflection intensity profile thus obtained is shown together with the cross-sectional view of the alignment mark in FIG. 14A. On the upper surface of the alignment mark 42 having an aluminum film deposited thereon is disposed a flat layer of a light absorption material 43 as shown in FIG. 14A. When the light absorption material 43 is disposed at least on the concave portion of the alignment mark 42 in this manner, it is possible to minimize the noise as shown in the graph of FIG. 14A. Moreover, since the intensity ratio between the reflection light from the convex portion and the reflection light from the concave portion of the substrate mark can be increased, the position of the step can be easily detected.

Figure 14B:
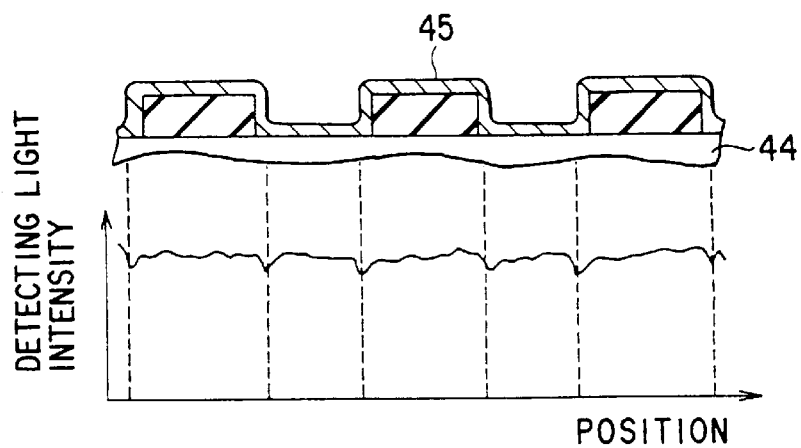

The reflection intensity profile obtained from the conventional substrate mark having a metallic film made of aluminum for example on its surface is shown together with the cross-sectional view of the alignment mark in FIG. 14B. when a light absorption material is not disposed on its surface as shown in FIG. 14B, a reflection intensity profile of only poor S/N ratio would be obtained due to the influence of the surface ruggedness of the metallic film. Moreover, it is difficult to detect the position of the step of the mark because of the high reflectance of the metallic film formed on the surface of the substrate.

As explained above, it is possible even with a system where the detection of position is performed through a light intensity signals to remarkably improve the alignment accuracy by disposing an alignment light absorption material on the surface of the mark.

Example I-6

This example relates to a method for carrying out an alignment using an extreme ultraviolet rays as an exposure light, and an alignment mark and manufacturing method to be used for improving the alignment accuracy will be explained.

A material to be incorporated into a resist for obtaining a light absorption material is required to have the following characteristics in addition to the characteristic of absorbing an alignment light. Namely, the material is low in absorption coefficient to the exposure light for photosensitizing a resist, and hardly gives a bad influence to the photosensitive property of the resist.

When g-line or i-line is used as an exposure light, i.e., a resist for g-line or i-line is used as a light absorption material, a difference between the wavelength of alignment light and the wavelength of exposure light can be enlarged by setting the wavelength region of the alignment light to a visible region. Therefore, it is possible to easily select a material which is capable of absorbing only an alignment light. Accordingly, by the addition of a material capable of absorbing alignment light into a resist for g-line or i-line, it is possible to obtain a light absorption material. Further, since the absorption to X-rays of most materials is close to zero, the kind of materials useful for adding into a resist for forming a light absorption material is more extensive in the case of a radiation-sensitive resist for X-rays as compared with the resists for g-line or i-line.

Depending on the kind of wavelength of exposure light, the addition of a dyestuff into a resist may give a bad influence in a degree to the resolution of pattern. In such a case, it may be generally advantageous to partially deposit a light absorption material on the surface of the concave or convex portion of the alignment mark so as to increase the contrast of the alignment-detecting light.

In this example, a thin layer capable of absorbing the alignment light is partially formed on the surface of the concave or convex portion of the alignment mark by using a converging light or a converging charged particle beam so as to increase the contrast of the alignment mark.

Carbon film may be formed as such a thin film mentioned above.

Example I-6-a

This example explains a process of forming a carbon film on the concave portion of the alignment mark region having aluminum film formed on the surface thereof by using FIB (Focused Ion Beam) apparatus.

Figure 15:
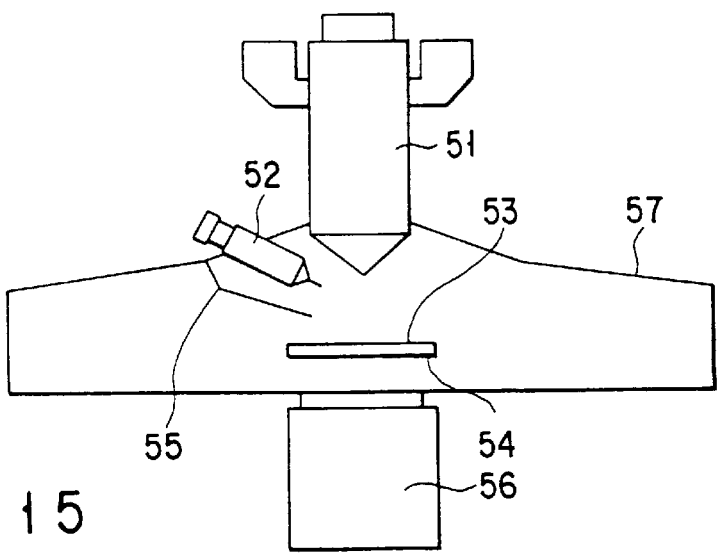
FIG. 15 shows a schematic view illustrating the construction of FIB apparatus.

FIG. 15 illustrates a schematic view of the FIB apparatus. As shown in FIG. 15, according to this apparatus, styrene gas is introduced via nozzle 52 into a sample chamber 57. On the other hand, an ion beam from a gallium ion gun 51, which has been accelerated to 30 kV is converged on a sample 53. Since the sample 53 is mounted on an X-Y stage, the converged ion beam can be irradiated to any desired position of the surface of the sample. When this apparatus is used, the carbon atom of styrene is dislocated by the energy of the accelerated ion beam thereby allowing a carbon film to be formed on any desired position of the sample 53.

As a sample, a high-reflective underlying substrate provided with a silicon oxide alignment mark and having an aluminum film formed on the alignment mark is used. On this mark region is formed a carbon film by the method mentioned above thereby obtaining an alignment mark of this example.

Figures 16A, 16B:
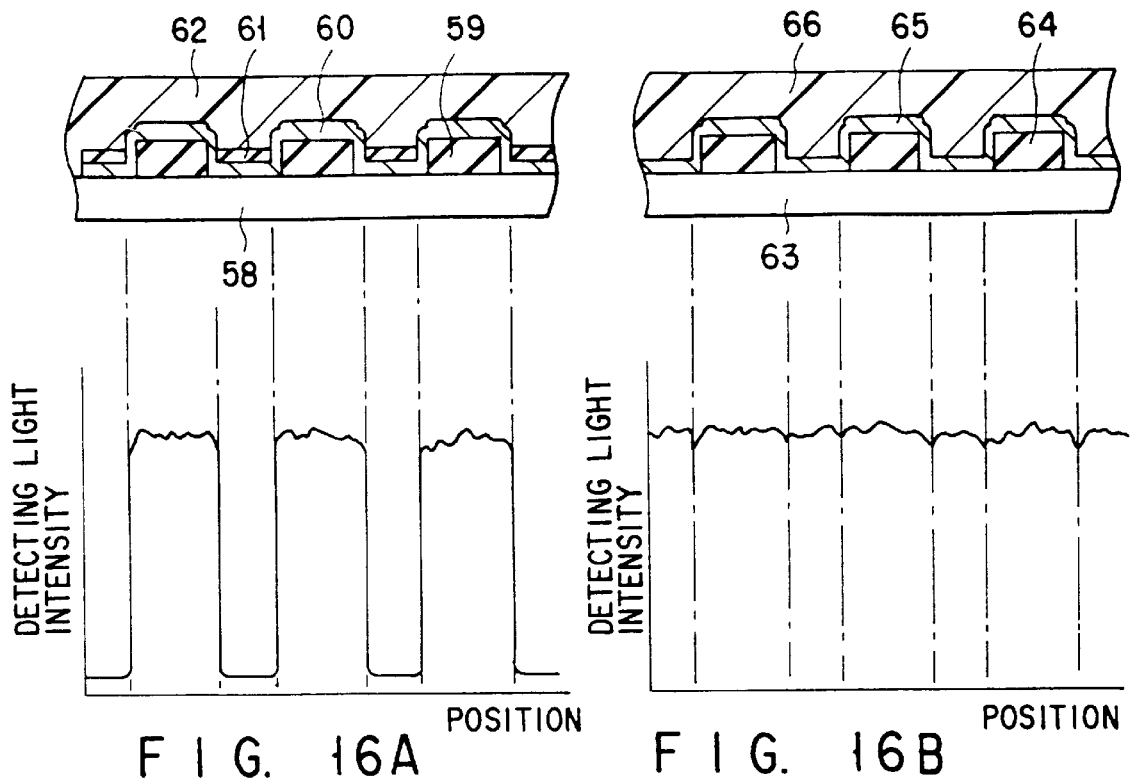
FIGS. 16A and 16B shows respectively a graph showing signals detected in Example I-6 and in the prior art.

The detecting light intensity profile of the alignment mark thus obtained is shown together with the cross-sectional view of the alignment mark having the carbon film formed thereon in FIG. 16A.

As shown in FIG. 16A, the concave portion of the alignment mark is deposited with the carbon film 61 so that the detecting light intensity of this concave portion is extremely lowered. Therefore, it is possible to accurately detect the position of step of the mark.

The detecting light intensity profile obtained from the conventional alignment mark is shown together with the cross-sectional view of this mark region in FIG. 16B. As shown in FIG. 16B, in the case of the conventional alignment mark, the noise in the detecting signals is large due to the influence of the surface ruggedness of the covering aluminum film. Moreover, it is difficult to detect the position of the step of the mark because of the high reflectance of the aluminum film.

Since the carbon film is formed only in the region of the alignment mark, the device region would not be affected by the process of forming the carbon film.

Example I-6-b

This example explains a process of forming a carbon film at a predetermined angle on the alignment mark region having aluminum film formed thereon by using a mask plate having an opening thus exposing the alignment region and using IBS (Ion Beam Sputter) apparatus.

Figure 17:
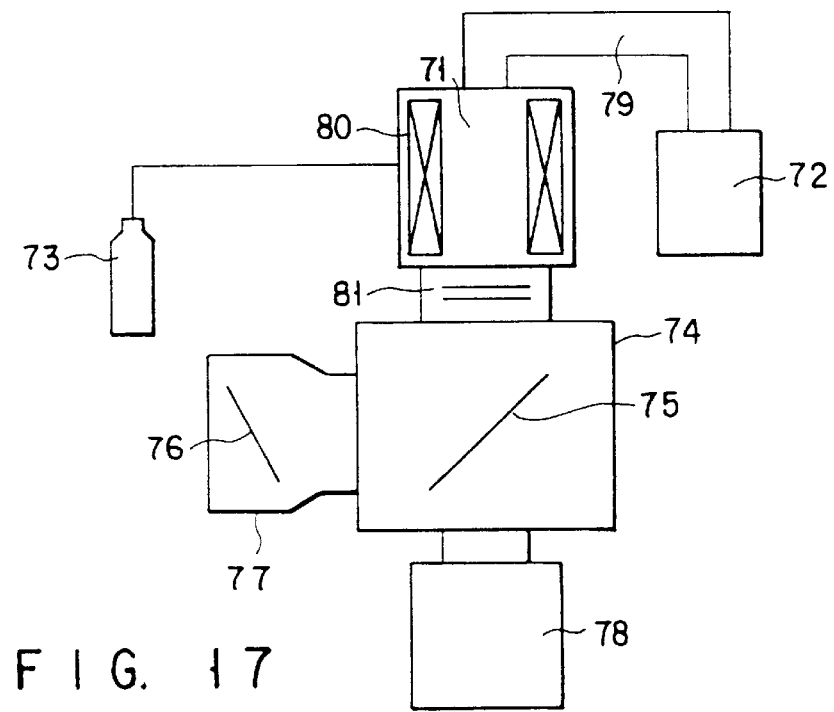
FIG. 17 shows a schematic view illustrating the construction of IBS apparatus.

FIG. 17 illustrates a schematic view of the IBS apparatus. As shown in FIG. 17, according to this apparatus, argon gas is ionized by means of an electromagnet 79 and a microwave injected in ECR ion gun 71 from microwave generator 72. Argon ion thus obtained is accelerated toward a parallel accelerating plate 81 thereby impinging the argon ion upon a carbon target 75 inclined at an angle of 45 degrees so as to sputter carbon atoms or molecules toward the sample 76 mounted at a predetermined angle. On the other hand, since the sample 76 is attached with a mask plate having an opening formed only at a portion corresponding to the alignment mark region, the carbon film is formed only on the predetermined region of the mark. When this apparatus is used, the carbon atom of styrene is dislocated by the energy of the accelerated ion beam thereby allowing a carbon film to be formed on any desired position of the sample 53.

As a sample, a high-reflective underlying substrate provided with a silicon oxide alignment mark and having an aluminum film formed on the alignment mark is used. On this mark region is formed a carbon film by the method mentioned above thereby obtaining an alignment mark of this example.

The detecting light intensity profile of the alignment mark thus obtained is shown together with the cross-sectional view of the alignment mark having the carbon film formed thereon in FIG. 18A.

As shown in FIG. 18A, on the right side of the convex portion of the alignment mark is deposited with the carbon film 61 so that the step on the left side of the convex portion is made more conspicuous. Therefore, it is possible to accurately detect the position of step of the mark.

Although the carbon film is formed from the right side of the convex portion of the mark as shown in FIG. 18A, this invention is not limited to this embodiment, but it is also possible to form the carbon film from any side.

The detecting light intensity profile obtained from the conventional alignment mark is shown together with the cross-sectional view of this mark region in FIG. 18B. As shown in FIG. 18B, in the case of the conventional alignment mark, the noise in the detecting signals is large due to the influence of the surface ruggedness of the covering aluminum film. Moreover, it is difficult to detect the position of the step of the mark because of the high reflectance of the aluminum film.

Since the carbon film is formed only in the region of the alignment mark as in the previous example, the device region would not be affected by the process of forming the carbon film.

According to this example, it is possible to increase the contrast of the alignment mark without leaving a light absorption material in the device region, even if it is difficult to add a material capable of absorbing an alignment light to a resist. Specifically, according to this example, the alignment accuracy over the metallic film can be improved when the metallic wiring is formed according to the following steps. Namely, first resist for extreme ultraviolet rays is coated over a metallic film thereby forming a resist film. Then, a predetermined pattern is transferred onto this resist through the use of a mask, and the resultant resist pattern is used as an etching mask to etch the metallic film thereby forming a metallic wiring. As a result, it is possible to accurately form a wiring with a fine line width, and therefore to increase the integration of semiconductor device by 10% or more.

Example II

Example II describes an example of improving the accuracy of detecting the alignment mark formed on an underlying substrate of low reflectance.

Example II-1

An example of disposing a high-reflective material on the concave portion of alignment mark region in the heterodyne alignment system applied in the X-ray proximity lithography is explained herein in detail.

The alignment system used herein is the same as that used in Example I-1. Referring to FIG. 1, HeNe laser beams 3 and 4 are irradiated to a mask mark 1 and a wafer mark 2 in the XZ plane and at an equi-incident angle. These HeNe laser beams 3 and 4 used are modulated in advance to 79.9 MHz and 80.0 MHz respectively by means of acousticoptical modulator (AOM). Each of the incident light 3 and 4 can be diffracted in any direction in accordance with the theory of diffraction. However, in this example, a phase difference between a detecting light 5 diffracted at the mask mark 1 in the particular direction in YZ plane and a detecting light 6 diffracted at the substrate mark 2 in the particular direction in YZ plane is measured, and based on this measurement, the alignment between the mask and the substrate is performed.

Accordingly, in order to increase the detecting signal intensity in an underlying substrate having a low reflectance, it is required to enhance the diffraction efficiency in the direction of the detector. The diffraction efficiency can be improved by increasing the reflectance of any one of the concave and convex portions of the checkered wafer alignment mark 2. By the way, the larger the reflectance ratio between the concave and convex portions of the mark is, the higher diffraction efficiency can be obtained.

According to this example, it is possible to improve the diffraction efficiency by filling the concave portion of the alignment mark region on the substrate with a high-reflective material so as to increase the reflectance of the concave portion.

Specifically, as shown in FIG. 19A, an aluminum film 93 as a high-reflective material was deposited on the silicon substrate 92 having alignment marks 91 (height: 0.2 $\mu$m)

made of silicon oxide. The thickness of the aluminum film 93 was about 0.3 μm which was formed by means of DC sputtering.

Then, a resist as an etching-adjusting material was coated through a spin coating method on the surface of the aluminum film 93 thereby forming a resist film 94 as shown in FIG. 19B. The resist employed herein was a material which exhibits almost the same etching rate in RIE using a chlorine-based gas as that of aluminum.

Subsequently, an etching using a chlorine-based gas 95 was performed thereby exposing the surface of the convex portion of the alignment mark 92. As a result, the concave portion of the alignment mark 92 was filled with aluminum film 93 as shown in FIG. 19C.

Consequently, the reflectance ratio between the concave and convex portions of the mark was increased to about 10 from the value of 1.3 which was obtained with a sample wherein the concave portion was not filled with aluminum film, and at the same time, the S/N ratio was also improved from 1.5 to about 7.

Example II-2

This example explains an application of an alignment system using an image processing. According to this system, a reflected light of alignment light irradiated onto the alignment mark region on a substrate is observed with an area sensor, and the alignment is performed through the image processing.

Specifically, according to this system, the minimum value in reflection intensity which corresponds to the position of the step is detected from a reflection intensity profile of alignment mark observed with an area sensor thereby performing the alignment. When the reflectance is small, the reflectance of the background is also small, so that S/N ratio of the intensity profile of alignment signal is also small thus deteriorating the alignment accuracy.

According to this example, it was possible to improve the alignment accuracy by filling the concave portion of the substrate mark with a high-reflective material.

Specifically, as shown in FIG. 20A, an aluminum film 93 as a high-reflective material was deposited on the silicon substrate 91 having alignment marks 92 (height: 0.4 μm) made of silicon oxide. The thickness of the aluminum film 93 was about 0.2 μm which was formed by means of DC sputtering.

Then, the resultant composite body was subjected to heat treatment at a temperature (about 500° C.) slightly higher than the softening point of aluminum thereby softening the aluminum. As a result, the softened aluminum disposed on the surface of the convex portion was allowed flow into the concave portion, and subsequently re-solidified to obtain a layer of flat surface. With this treatment, an underlying substrate having aluminum filled in the concave portion of the alignment mark was obtained as shown in FIG. 20B.

The reflection intensity profile of the underlying substrate, which was detected by a line sensor is shown in FIG. 21A. As shown in FIG. 21A, the concave portion of the alignment mark was filled with a high-reflective material so as to increase the reflectance ratio between the concave portion and the convex portion. As a result, it has become possible to easily detect the position of step of the mark.

The reflection intensity profile of the conventional underlying substrate is shown in FIG. 21B. It will be seen that the minimum value indicating the position of the step is buried within the noise thus making it unclear in the case of a low reflectance substrate. When compared with the profile shown in FIG. 21B, the reflectance ratio of this example is about 10 times as high as that of this conventional product. It will be seen from this result that the alignment accuracy can be greatly improved by filling the concave portion of alignment mark with a high-reflective material.

This example may be applied to an alignment system where a diffracted light from an alignment mark is utilized, thus obtaining almost the same results as in the Example II-1.

Example II-3

This example explains a method of manufacturing an underlying substrate, which comprises a combination of a heating treatment and a grinding treatment.

Specifically, as shown in FIG. 22A, a carbon film 96 functioning as a stopper was deposited on the silicon substrate 91 having alignment marks 92 (height: 0.4 μm) made of silicon oxide. The thickness of the carbon film 96 was about 0.01 μm which was formed by means of RF sputtering. Then, aluminum acting as a light reflective material was deposited through CD sputtering to a thickness of about 0.5 μm, which was slightly thicker than that of the step as shown in FIG. 22B.

Then, the resultant composite body was subjected to heat treatment at a temperature (about 500° C.) slightly higher than the softening point of aluminum thereby softening the aluminum. As a result, the softened aluminum disposed on the surface of the convex portion was allowed flow into the concave portion, and subsequently re-solidified to obtain a layer of flat surface as shown in FIG. 22C.

Further, as shown in FIG. 22D, colloidal silica 97 (particle diameter: 0.03 μm to 0.1 μm) was used as an abrasive to grinding the surface of the aluminum film 93. Finally, the substrate was subjected to an etching treatment using oxygen plasma 98 thereby removing the carbon film 96 remaining on the surface of the convex portion of the alignment mark 92.

Through processing of the underlying substrate according to the above steps, it was possible to improve the flatness of the surface of aluminum film as compared with Example II-2. Additionally, it was possible to completely remove the aluminum remaining on the convex portion of the alignment mark. Therefore, the noise of alignment signal due to the surface ruggedness of the aluminum film or due to the aluminum remaining on the convex portion can be decreased as compared with the method of Example II-2. Further, the S/N ratio of alignment signal of this example was found to be about 1.5 times as high as that of Example II-2.

Example II-4

This example explains a case where a high-reflective material is deposited on the convex portion of the alignment mark.

Figure 23A:
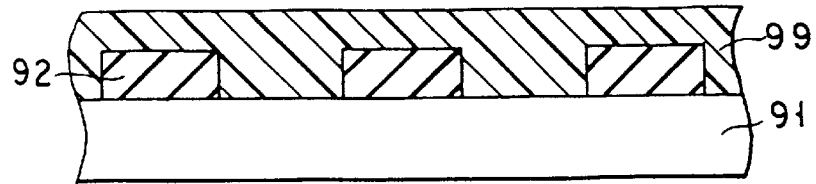
FIGS. 23A to 23D shows respectively a sectional view illustrating the manufacturing method of alignment mark of Example II-4.

Specifically, as shown in FIG. 23A, a resist film 99 was deposited through a spin coating method on the silicon substrate 91 having alignment marks 92 (height: 0.4 μm) made of silicon oxide. The thickness of the resist film 99 thus formed on the surface of the convex portion was about 0.3 μm.

Figure 23B:
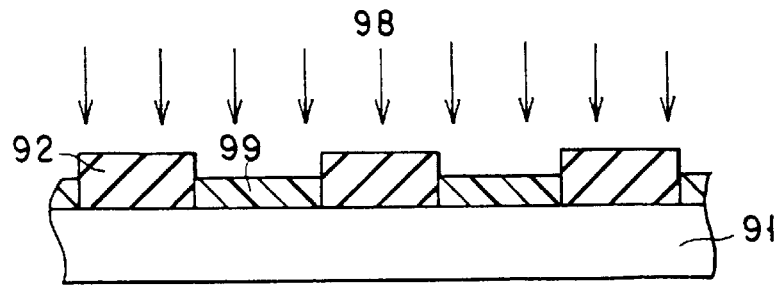

Then, the resist film formed on the convex portion of the alignment mark 92 was completely removed by an etching treatment using an oxygen plasma 98, leaving the resist film 99 only on the concave portion as shown in FIG. 23B. The thickness of the resist film 99 thus left on the concave portion was about 0.2 μm. Therefore, there were still a difference of 0.2 μm in height between the surface of the resist film 99 and the convex portion. Further, this resist film exhibited a sufficient selective ratio in the above etching treatment in distinction from silicon or silicon oxide constituting the underlying substrate so that the underlying structures constituted by these materials were not affected by the etching treatment.

Figure 23C:
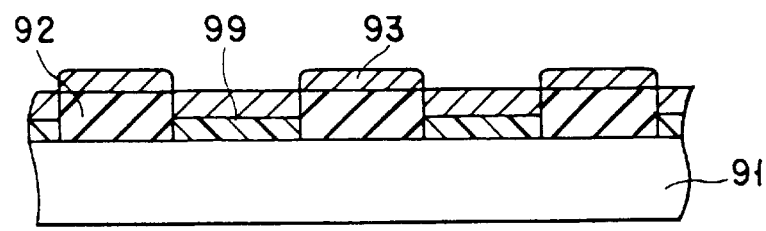

Subsequently, an aluminum film 93 having a uniform thickness of about 0.2 μm was formed on all of the concave and convex portions of the alignment mark 92 by way of DC sputtering as shown in FIG. 23C.

Figure 23D:
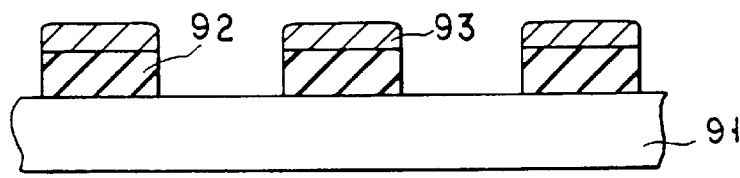

Finally, the resist film 99 left on the concave portion of the alignment mark 92 was dissolved using an organic solvent, thereby removing the aluminum film 93 deposited on the resist film 99, thus leaving the aluminum film deposited only on the convex portion of the alignment mark as shown in FIG. 23D.

Consequently, the reflectance ratio between the concave and convex portions of the mark was increased to about 10 from the value of 1.3 which was obtained with a sample wherein the convex portion was not deposited with aluminum film, and at the same time, the S/N ratio was also improved from 1.5 to about 7.

According to this example, the surface of the convex portion of the alignment mark is covered with a flat aluminum film, so that not only the signal intensity from the convex portion can be magnified, but also, if the shape of the convex portion is relatively deformed or collapsed as whole, the noise of alignment signal due to the collapsed shape of the convex portion can be minimized.

Example II-5

This example explains a case where a high-reflective material is deposited on all of the concave and convex portions of the alignment mark.

Figure 24A:
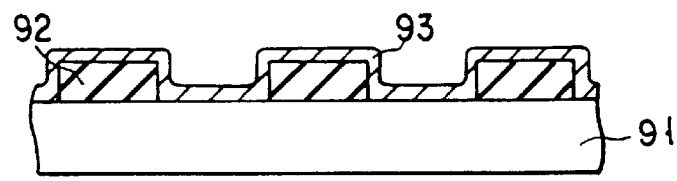
FIGS. 24A and 24B shows respectively a sectional view illustrating the manufacturing method of alignment mark of Example II-5.

Specifically, as shown in FIG. 24A, an aluminum film 93 was deposited through a DC sputtering method on the silicon substrate 91 having alignment marks 92 (height: 0.4 μm) made of silicon oxide. The thickness of the aluminum film 93 was about 0.1 μm throughout the concave and convex portions of the alignment mark, thereby enhancing the reflection coefficient of the alignment mark region as a whole.

Figure 24B:
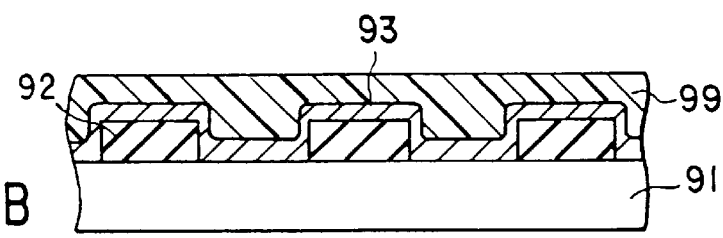

Then, a resist film 99 containing a predetermined dyestuff was deposited through a spin coating method on the aluminum film 93 as shown in FIG. 24B. As the dyestuff mentioned above, about 1.0% by weight of an anthraquinone-based compound exhibiting a large absorption to the alignment light was incorporated into the resist.

Since HeNe laser (wavelength: 633 nm) was used as a light source in the alignment, the above anthraquinone-based compound was used as a dyestuff capable of absorbing a red light of this wavelength. There is no possibility of deteriorating the features of the resist such as sensitivity or resolution by the addition of this anthraquinone-based compound into the resist. The concentration of the dyestuff in the resist was controlled such that the ratio of (reflection intensity from the concave portion)/(reflection intensity from the convex portion) on the mark becomes about 0.8.

The structure shown in this example is intended as in the case of Example II-4 to improve the S/N ratio of the alignment signal by increasing the reflection coefficient from the convex portion of the alignment mark rather than the reflection coefficient from the concave portion. Since both of the convex and concave portions of the mark are covered with aluminum film in this example, the generation of noise originating from the collapsing in shape of the convex portion as well as the concave portion, if any, can be minimized.

As mentioned above, HeNe laser (wavelength: 633 nm) was used as a light source in the alignment, and for the purpose of enabling the resist to absorb this laser light, an anthraquinone-based compound was used as a dyestuff for the resist in this example.

However, this invention is not limited to this combination. For example, if a resist which is inherently capable of absorbing light of a specific wavelength is employed as a coating material on a light reflective layer, any suitable alignment light may be selected so as to match with this specific wavelength, thereby obtaining substantially the same effects as the C above combination. For example, if a red colored resist for i-line is selected, a light source such as HeCd laser may be used.

In the above description of this invention, examples of improving the detecting accuracy of alignment mark on a high reflectance substrate as well as on a low reflectance substrate are explained.

However, this invention is also applicable to an alignment exposure for forming a metallic wiring wherein an alignment accuracy may more likely be deteriorated among a plurality of aligning processes in the manufacture of a semiconductor device.

To be more specific, for the purpose of forming a metallic wiring, a silicon oxide film is first formed on a wafer, and then, a prescribed region of the silicon oxide film is deleted. Subsequently, a metallic film such as aluminum film is deposited all over the wafer by way of magnetron sputtering. After depositing a resist film on the metallic film, an alignment exposure is conducted via a mask having a predetermined pattern formed therein, thereby transferring the pattern of the mask. After finishing the development of the pattern, the metallic film is etched, using the patterned resist as an etching mask, by means of ECR etching thereby forming the metallic wiring. Therefore, in the formation of a metallic wiring, an alignment exposure on a metallic film (which is poor in alignment accuracy) is indispensable. For the purpose of forming a metallic wiring of high reliability even with such a low alignment accuracy, it is required according to the conventional technique to perform the patterning under the conditions in which the resolution inherent to a resist is deliberately dropped. Further, according to the conventional technique, it is difficult to form a wiring of desired line width in a single step, so that a plurality of similar steps have to be repeated.

Consequently, the miniaturization of semiconductor device is highly dependent not only on the improvement of resolution of a resist, but also on the alignment accuracy in the occasion of performing the alignment of a mask for forming a metallic wiring.

One of the object of this invention is to provide a method for improving an alignment mark of poor alignment accuracy in order to make the most of the capacity of an alignment system which has been conventionally mounted on an alignment exposure apparatus. It has been made possible according to the alignment exposure system of this invention to improve the alignment accuracy in the formation of metallic wiring to the same level as obtainable in the alignment exposure using other kinds of substrate. Consequently, it has become possible to perform the alignment exposure even in the formation of metallic wiring under the conditions in which the critical (maximum) resolution obtainable by the selections of exposing method and resist could be made the most of. Moreover, since a metallic wiring of high reliability can be obtained by a single step, the manufacturing process can be simplified, thus reducing the number of manufacturing step.

As explained above, the improvement of alignment accuracy in the formation of metallic wiring makes it possible to miniaturize a semiconductor device. Specifically, due to the improvement of the alignment accuracy in the formation of metallic wiring to the same level as obtainable in the alignment exposure using other kinds of substrate, it has become possible to miniaturize a semiconductor device such as DRAM by about 10%. This means that the design rule (minimum line width) to be required can be loosened to a large extent, the line width can be controlled more easily, and a reliability of the wiring is increased, so that a yield can be increased remarkably.

As explained above, it is possible according to this invention to perform a high accuracy alignment exposure even on a high-reflective substrate which is inherently poor in alignment accuracy, and to manufacture a semiconductor device of high integration improved by 5% or more as compared with the conventional semiconductor device.

Further, it is possible according to this invention to remarkably improve the alignment accuracy even on a low-reflective substrate which is inherently poor in alignment accuracy. It is also possible according to this invention to improve a measurement accuracy even when this invention is applied to a system for evaluating an alignment by observing a pattern obtained from the alignment.

The alignment mark according to this invention is useful in an alignment exposure technique such fine workings in the manufacture of a semiconductor device, and would be greatly valuable in industries.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An alignment mark illuminated by radiation from an alignment radiation source for aligning a substrate having a low reflectance with a mask during manufacture of a semiconductor device, said alignment mark comprising:

at least one step directly formed on a surface of said substrate and having a substrate surface portion and an outward projecting nonreflecting convex portion; and a reflective metallic film directly formed on the outward projecting nonreflecting convex portion to from at least one reflective portion, wherein a side of the reflective portion is substantially aligned with a side of the outward projecting nonreflecting convex portion.

2. An alignment mark illuminated by radiation from an alignment radiation source for aligning a substrate having a low reflectance with a mask during manufacture of a semiconductor device, said alignment mark comprising:

at least one step directly formed on a surface of said substrate and having a substrate surface portion and an outward projecting nonreflecting convex portion; and a reflective metal film directly formed on the substrate surface portion and filling a space between two adjacent outward projecting nonreflecting convex portions to form at least one reflective portion, wherein a level of an upper surface of the reflective portion is substantially the same as that of an upper surface of the outward projecting nonreflecting convex portion.

3. An alignment mark illuminated by radiation from an alignment radiation source for aligning a substrate having a low reflectance with a mask during manufacture of a semiconductor device, said alignment mark comprising:

at least one step directly formed on a surface of said substrate and having a substrate surface portion and an outward projecting nonreflecting convex portion; and a reflective metallic film and a stopper film interposed at least between the reflective metallic film and the substrate surface portion, the reflective metallic film and the stopper film filling a space between two adjacent outward projecting nonreflecting convex portions to form at least one reflective portion, wherein a level of an upper surface of the reflective portion is substantially the same as that of an upper surface of the outward projecting nonreflecting convex portion.

* * * * *

UNITED STATES PATENT AND TRADEMARK OFFICE
CERTIFICATE OF CORRECTION

PATENT NO. : 5,969,428

DATED : October 19, 1999

INVENTOR(S): Hiroshi NOMURA, et al.

It is certified that an error appears in the above-identified patent and that said Letters Patent is hereby corrected as shown below:

On the title page, item [54], and at the top of column 1, the title should be:

--ALIGNMENT MARK FOR USE IN MAKING
SEMICONDUCTOR DEVICES-- .

Signed and Sealed this

Twenty-ninth Day of August, 2000

Attest:

Q. TODD DICKINSON

Attesting Officer

Director of Patents and Trademarks